(12) United States Patent
Evirgen et al.

(10) Patent No.: US 12,272,718 B2
(45) Date of Patent: Apr. 8, 2025

(54) INFRARED DETECTOR IMPROVED VIA ENGINEERING OF THE EFFECTIVE MASS OF CHARGE CARRIERS

(71) Applicants: LYNRED, Palaiseau (FR); COMMISSARIAT A L'ENERGIE ATOMIQUE ET AUX ENERGIES ALTERNATIVES, Paris (FR)

(72) Inventors: Axel Evirgen, Palaiseau (FR); Jean-Luc Reverchon, Palaiseau (FR); Virginie Trinite, Palaiseau (FR)

(73) Assignees: LYNRED, Palaiseau (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 64 days.

(21) Appl. No.: 18/275,174

(22) PCT Filed: Feb. 1, 2022

(86) PCT No.: PCT/EP2022/052347
§ 371 (c)(1),
(2) Date: Jul. 31, 2023

(87) PCT Pub. No.: WO2022/167419
PCT Pub. Date: Aug. 11, 2022

(65) Prior Publication Data

US 2024/0136384 A1    Apr. 25, 2024
US 2024/0234473 A9    Jul. 11, 2024

(30) Foreign Application Priority Data

Feb. 5, 2021 (FR) ..................... 2101135

(51) Int. Cl.
H01L 31/0304    (2006.01)
H01L 27/146     (2006.01)
H01L 31/0352    (2006.01)

(52) U.S. Cl.
CPC .. H01L 27/14649 (2013.01); H01L 31/03046 (2013.01); H01L 31/035236 (2013.01)

(58) Field of Classification Search
CPC ......... H01L 27/14649; H01L 31/03046; H01L 31/035236; H01L 31/036; H01L 31/1035; H01L 31/105; H01L 31/109
See application file for complete search history.

(56) References Cited

U.S. PATENT DOCUMENTS 5,136,602 A    8/1992  Sugawara

FOREIGN PATENT DOCUMENTS

EP    1 642 345 B1    11/2008
EP    3 482 421 B1    5/2020
(Continued)

OTHER PUBLICATIONS

Ishikawa, et al., "Strain-induced enhancement of near-infrared absorption in Ge epitaxial layers grown on Si substrate", J. Appl. Phys., vol. 98, 013501, 2005.
(Continued)

Primary Examiner — Mark R Gaworecki
(74) Attorney, Agent, or Firm — BakerHostetler

(57) ABSTRACT

A device for detecting infrared radiation, includes at least one pixel having an axis in a direction Z, the pixel comprising a first absorbent planar structure comprising at least one semiconductor layer. The composition of the materials used to produce the at least one layer of the first absorbent planar structure is chosen such that: the first absorbent planar structure has an effective valence band formed by a plurality of energy levels. Each energy level is occupied by (Continued)

one of: a first type of positive charge carrier, called heavy holes, having a first effective mass; or a second type of positive charge carrier, called light holes, having a second effective mass strictly less than the first effective mass. The maximum energy level of the effective valence band is occupied by light holes along the axis of the pixel.

16 Claims, 11 Drawing Sheets

(56) References Cited

FOREIGN PATENT DOCUMENTS

| JP | 6-151940 A | | 5/1994 |
|---|---|---|---|
| JP | 8-160472 A | | 6/1996 |
| JP | H06151940 A | * | 6/1996 |

OTHER PUBLICATIONS

Xie, et al., "Infrared absorption enhancement in light and heavyhole inverted Ga1xInxAs/Al1yInyAs quantum wells", Appl. Phys. Lett., vol. 59, pp. 3601-3603, 1991.

* cited by examiner

INFRARED DETECTOR IMPROVED VIA ENGINEERING OF THE EFFECTIVE MASS OF CHARGE CARRIERS

CROSS-REFERENCE TO RELATED APPLICATIONS

This application is a National Stage of International patent application PCT/EP2022/052347, filed on Feb. 1, 2022, which claims priority to foreign French patent application No. FR 2101135, filed on Feb. 5, 2021, the disclosures of which are incorporated by reference in their entireties.

FIELD OF APPLICATION

The present invention relates to the field of infrared (IR) imaging and in particular to a radiation detector or photodetector fabricated with heterostructures based on III-V semiconductor materials. More specifically, the invention relates to an imaging device for imaging in the short-wave infrared (SWIR) and the medium-wave infrared (MWIR) at non-cryogenic temperatures.

Problem Addressed

Imagers operating in the infrared range are generally formed by assembling a matrix comprising a plurality of elementary pixels based on photodiodes that transform a flux of incident photons into photogenerated charge carriers, and a readout circuit, commonly referred to as ROIC for "Read-Out Integrated Circuit", for processing the electrical signal from the pixels of the detector.

The invention proposes to solve a technical problem in this field consisting in designing a matrix detector operating in the short-wave infrared (SWIR) and the medium-wave infrared (MWIR) at non-cryogenic temperatures by improving the quantum efficiency of the detector while at the same time minimizing the phenomenon of crosstalk between the pixels of the matrix and also minimizing dark current noise compared to the solutions from the prior art.

We will begin by physically explaining these three interrelated characteristics of an infrared matrix sensor.

By way of illustration, in a space (X,Y,Z), the axis Δ of each pixel is defined in the direction Z, and the plane whose normal is the axis of the pixel, called normal plane, is the plane (X,Y).

Each infrared matrix detector is characterized by a cutoff wavelength λc defined by the effective energy gap $Eg_{eff}$ of the absorbent region of each pixel of the matrix detector according to the Planck-Einstein relation $\lambda c = hc/Eg_{eff}$, where h is Planck's constant and c is the speed of light in a vacuum. The cutoff length then depends on the energy band structure of the materials used to produce the absorbent region of the pixel.

The "quantum efficiency" of a semiconductor-based IR radiation detector is understood to mean the ratio of the number of electron/hole pairs generated by the photoelectric effect to the number of photons passing through the structure of a pixel belonging to the IR radiation detector. The quantum efficiency depends on the absorption coefficient and on the diffusion length $L_{dz}$ in the structure of the pixel along the axis of the pixel. The absorption coefficient depends on the materials used to produce the structure of the pixel. The diffusion length $L_{dz}$ along the axis of the pixel increases with the diffusion coefficient along the axis of the pixel. The diffusion coefficient is inversely proportional to the effective mass $m_{hz}$ of the minority charge carriers (holes in the case of an N-doped absorbent region) along the axis of the pixel.

The crosstalk phenomenon results from interference between adjacent pixels, the charges photogenerated by a pixel being able to diffuse to a neighboring pixel along the plane whose normal is the axis of the pixel. The amplitude of the crosstalk phenomenon in an infrared matrix detector increases with the diffusion length of the minority charge carriers in the normal plane (X,Y), denoted $L_{dx,y}$. The diffusion length $L_{dx,y}$ along the plane normal to the pixel increases with the diffusion coefficient in the same plane. The diffusion coefficient is inversely proportional to the effective masses $m_{hx}$ and $m_{hy}$ of the minority charge carriers (holes in the case of an N-doped absorbent region) in the plane normal to the pixel.

Dark current $J_{dark}$ is the current of charge carriers generated in the absence of incident radiation in the materials that form the absorbent region of a pixel of the detection matrix. Dark current may be expressed by the following formula:

$$J_{dark} = \frac{n_i^2}{\tau N} d$$

Where $n_i$ is the intrinsic charge carrier density in the absorption region, T is the lifetime of the minority charge carriers, N is the doping and d is the thickness of the absorbent region. N and d are dimensional parameters, and T depends on the fabrication conditions. These three parameters need to be optimized in order to find a compromise that makes it possible to minimize dark current while keeping a quantum efficiency sufficient for good operation. $n_i$ is more fundamental and depends on the effective mass of the minority charge carriers along the axis of the pixel $m_{hz}$ and along the plane normal to the pixel $m_{hx}$ $m_{hy}$. The engineering of the composition of the materials of the absorption region makes it possible to control said effective masses in order to find the compromise between quantum efficiency, dark current and crosstalk, and to do so for a given cutoff frequency at a given operating temperature.

To summarize, we have demonstrated that: on the one hand, quantum efficiency is a technical characteristic that determines the electro-optical performance of an infrared detector. On the other hand, dark current noise and the crosstalk phenomenon exhibit technical constraints that limit said performance.

The technical problem to be solved is then that of developing SWIR (1.4 μm to 3 μm) and MWIR (3 μm to 8 μm) infrared detectors with pixels comprising absorbent regions that make it possible, with an improvement of the following interrelated criteria, to: maximize quantum efficiency and minimize crosstalk and dark current noise constraints at a given cutoff frequency.

BACKGROUND

European patent application EP3482421B1 describes a matrix infrared image detector comprising a plurality of pixels. The planar absorption structure of each pixel according to the solution proposed in that application is produced by a bulk InGaAsSb material on a substrate made of GaSb material in a specific vertical architecture. In addition, European patent EP1642345B1 describes a matrix infrared radiation detector comprising a plurality of pixels. The planar absorption structure of each pixel according to the solution proposed by that patent is produced by a bulk InGaAsSb material on a substrate made of GaSb material.

The drawback of the solutions proposed by these two documents is that the crosstalk phenomenon is amplified when the pitch of the pixel reaches a distance less than 15 µm. Moreover, the solutions proposed by these two documents are unable to operate at cutoff frequencies around 5 µm.

The publication "Strain-induced enhancement of near-infrared absorption in Ge epitaxial layers grown on Si substrate" by "Ikishawa et al" discloses an infrared detector with an absorption region made of bulk germanium deposited epitaxially on silicon. The drawback of that solution is that the fabrication of the detector involves heat treatment of the epitaxial layers. The heat treatment and the amplitude of the lattice mismatch between silicon and germanium lead to dislocations generated by the relaxation of the material forming the absorbent region. Thus, the infrared detector will exhibit fragility from a mechanical point of view and degradation of the electro-optical performance of the pixels.

The publication "Infrared absorption enhancement in light and heavyhole inverted Ga1xInxAs/Al1yInyAs quantum wells" by "Xie et al" discloses an infrared detector with InGaAS/InAlAs quantum wells in stress-compensated conditions. The drawback of the solution proposed by that document is that it is not functional in the short-wave infrared (SWIR from 1.4 µm to 3 µm) and in the medium-wave infrared (MWIR from 3 µm to 8 µm).

Answer to the Problem and Provision of a Solution

To overcome the limitations of the existing solutions with regard to optimizing the point of compromise between quantum efficiency, minimizing crosstalk and dark current in the SWIR and the MWIR, the invention provides a number of embodiments of a pixel structure comprising a planar absorption structure having a valence band with a maximum energy level occupied by light holes greater than that occupied by heavy holes along the axis of the pixel. The planar absorption structure according to the invention may be formed by a superlattice or made of a bulk material. The invention details embodiments with examples of choices of materials for the planar absorption structure, ranges of compositions of the semiconductor alloys and ranges of dimensions of the thicknesses of the layers of the planar absorption structure according to the invention. The compositions (molar fractions of III-V alloys) of the materials used to produce the one or more layers of the planar absorption structure according to the invention are chosen so as to invert heavy holes and light holes along the axis of the pixel while at the same time avoiding the appearance of interface dislocations due to the relaxation of the materials. This makes it possible, at the same time, in comparison with the solutions from the prior art, to improve the performance of the IR detector in terms of quantum efficiency, reducing dark current and reducing crosstalk.

SUMMARY OF THE INVENTION

The subject of the invention is a device for detecting infrared radiation, comprising at least one pixel having an axis in a direction Z, said pixel comprising a first absorbent planar structure comprising at least one semiconductor layer. Each layer of the first absorbent planar structure is arranged in a crystal lattice structure. The first absorbent planar structure is N-doped and produced epitaxially on a substrate, and the composition of the materials used to produce the at least one layer of the first absorbent planar structure is chosen such that:

the first absorbent planar structure has an effective valence band formed by a plurality of energy levels. Each energy level is occupied by one of:
a first type of positive charge carrier, called heavy holes, having a first effective mass;
or
a second type of positive charge carrier, called light holes, having a second effective mass strictly less than the first effective mass.
The maximum energy level of the effective valence band is occupied by light holes along the axis of the pixel;
The crystal lattice structure of said layer does not exhibit any dislocations resulting from mechanical relaxation of said lattices. The effective mass of the positive charge carriers along the axis of the pixel is less than half the effective mass of the positive charge carriers in directions defining a plane orthogonal to the axis of the pixel.

According to one particular aspect of the invention, the substrate is arranged in a crystal lattice structure and the composition of the materials used to produce the at least one layer of the first absorbent planar structure is chosen such that:
the lattices of the at least one layer forming said absorbent planar structure experience internal mechanical stresses so as to adapt to the lattices of the crystal structure of the substrate,
and such that the stress resulting from the sum of the internal mechanical stresses is a tensile stress.

According to one particular aspect of the invention, the effective mass of the holes carrying positive charges along the axis of the pixel is less than one tenth of the mass of a free electron.

According to one particular aspect of the invention, the difference between the maximum energy level occupied by light holes and the maximum energy level occupied by heavy holes is greater than the product of the Boltzmann constant and the operating temperature.

According to one particular aspect of the invention, the composition of the materials used to produce the at least one layer of the first absorbent planar structure is chosen such that the amplitude of the stress resulting from the sum of the internal mechanical stresses is less than a predetermined dislocation limit stress. The density of dislocations in the first absorbent planar structure is strictly less than $10^4$ dislocations/cm2.

According to one particular aspect of the invention, the first absorbent planar structure consists of a single layer made of a bulk III-V semiconductor material.

According to one particular aspect of the invention, the bulk semiconductor material is the quaternary alloy $Ga_{x1}In_{1-x1}As_{y1}Sb_{1-y1}$, where x1 is the molar fraction of gallium in the alloy $Ga_{x1}In_{1-x1}As_{y1}Sb_{1-y1}$ and y1 is the molar fraction of arsenic in the alloy $Ga_xIn_{1-x1}As_{y1}Sb_{1-y1}$.

According to one particular aspect of the invention:
the substrate is made of gallium antimonide GaSb;
the molar fraction x1 of gallium Ga in the alloy $Ga_xIn_{1-x1}As_{y1}Sb_{1-y1}$ is between 0 and 1;
and the molar fraction y1 of arsenic As in the alloy $Ga_xIn_{1-x1}As_{y1}Sb_{1-y1}$ is between a minimum value and a maximum value such that:
the minimum value is an affine function of the molar fraction x1 of gallium Ga in the alloy $Ga_xIn_{1-x1}As_{y1}Sb_{1-y1}$ characterized by a leading coefficient equal to −0.92 and an ordinate at the origin equal to 0.93, the maximum value of the molar fraction y1 of arsenic As in the alloy $Ga_xIn_{1-x1}As_{y1}Sb_{1-y1}$ is an affine function of the molar fraction x1 of gallium Ga in the alloy $Ga_xIn_{1-x1}As_{y1}Sb_{1-y1}$ characterized by a leading coefficient equal to −0.92 and an ordinate at the origin equal to 0.97.

According to one particular aspect of the invention:
The substrate is made of indium antimonide InSb;
and the molar fraction x2 of gallium Ga in the bulk semiconductor material is between 0.02 and 0.05;
and the molar fraction y2 of arsenic As in the bulk semiconductor material is between 0.02 and 0.05.

According to one particular aspect of the invention, the first absorbent planar structure comprises a first superlattice comprising a stack along the axis of the pixel of an elementary group of semiconductor layers comprising:
  a first layer made of a first semiconductor material having
    a first conduction band minimum value;
    a first valence band maximum value;
    a first energy gap value;
  at least one second layer made of a second semiconductor material having:
    a second conduction band minimum value strictly less than the first conduction band minimum value;
    a second valence band maximum value strictly less than the first valence band maximum value;
    and a second energy gap value.
  The lattices of the first layer experience tensile stresses and the lattices of the second layer experience compressive stresses.

According to one particular aspect of the invention, the first superlattice has a first effective valence band maximum value and the positive charge carriers in the first layer of an elementary group see an energy barrier equal to the difference between:
  the maximum energy level of the effective valence band occupied by heavy holes; and a first effective valence band maximum value.
  The product of said energy barrier and the thickness of the second layer is less than a predetermined value.

According to one particular aspect of the invention, the second semiconductor material is the ternary alloy $InAs_{y3}Sb_{1-y3}$, where y3 is the molar fraction of arsenic in the alloy $InAs_{y3}Sb_{1-y3}$.

According to one particular aspect of the invention, the first semiconductor material is the quaternary alloy $Ga_{x3}In_{1-x3}As_{y4}Sb_{1-y4}$, where x3 is the molar fraction of gallium in the alloy $Ga_{x3}In_{1-x3}As_{y4}Sb_{1-y4}$ and y4 is the molar fraction of arsenic in the alloy $Ga_{x3}In_{1-x2}As_{y4}Sb_{1-y4}$.

According to one particular aspect of the invention:
  the molar fraction y3 of arsenic in the alloy $InAs_{y3}Sb_{1-y3}$ is between 0.6 and 0.88,
  the molar fraction x3 of gallium in the alloy $Ga_{x3}In_{1-x3}As_{y4}Sb_{1-y4}$ is between 0.2 and 0.5,
  and the molar fraction y4 of arsenic in the alloy $Ga_{x3}In_{1-x3}As_{y4}Sb_{1-y4}$ is between a minimum value and a maximum value such that:
    the minimum value of the molar fraction y4 of arsenic in the alloy $Ga_{x3}In_{1-x3}As_{y4}Sb_{1-y4}$ being an affine function of the molar fraction x3 of gallium in the alloy $Ga_{x3}In_{1-x3}As_{y4}Sb_{1-y4}$ characterized by a leading coefficient equal to −0.92 and an ordinate at the origin equal to 0.93, the maximum value of the molar fraction y4 of arsenic in the alloy $Ga_{x3}In_{1-x3}As_{y4}Sb_{1-y4}$ being an affine function of the molar fraction x3 of gallium in the alloy $Ga_{x3}In_{1-x3}As_{y4}Sb_{1-y4}$ characterized by a leading coefficient equal to −0.66 and an ordinate at the origin equal to 1.13.

According to one particular aspect of the invention, the first absorbent planar structure has a first effective valence band maximum value, a first effective conduction band minimum value and a first effective energy gap value. The pixel comprises, along its axis and in this order:
  the substrate;
  A lower contact structure made of a third semiconductor material or of a lower contact superlattice, the structure being N+-doped and having:
    a lower contact valence band maximum value strictly less than the effective valence band maximum value of the first absorbent planar structure;
    and a lower contact energy gap value greater than or equal to the first effective energy gap value of the first absorbent planar structure.
  An overall absorbent planar structure comprising:
    the first absorbent planar structure; the layers of said first absorbent planar structure being N-doped;
  one or more transition structures.
  the transition structure in contact with the overall absorbent planar structure is called initial transition structure. The initial transition structure is made of a fourth semiconductor material or of a first superlattice of the transition structure, the structure being N-doped and having:
    a valence band maximum value of the initial transition structure strictly greater than the effective valence band maximum value of the first absorbent planar structure:
    and an energy gap value of the initial transition structure strictly greater than the first effective energy gap value of the first absorbent planar structure.
  An upper contact structure made of a fifth semiconductor material or of an upper contact superlattice, the structure being P+-doped and having:
    an upper contact valence band maximum value strictly greater than the valence band maximum value of each transition structure;
    and an upper contact energy gap value strictly greater than the energy gap value of each transition structure.

According to one particular aspect of the invention, the pixel comprises multiple transition structures of rank i=1 to N increasing going from the overall absorbent planar structure to the upper contact structure, where N is a non-zero natural integer, such that:
  each transition structure of rank i=2 to N has a valence band maximum value strictly greater than the valence band maximum value of the transition structure of rank i−1.

BRIEF DESCRIPTION OF THE DRAWINGS

Other features and advantages of the present invention will become more apparent on reading the following description in relation to the following appended drawings.

FIG. 4b illustrates a diagram of the band structure along the axis of the pixel of FIG. 4a.

DETAILED DESCRIPTION

Figure 1A:
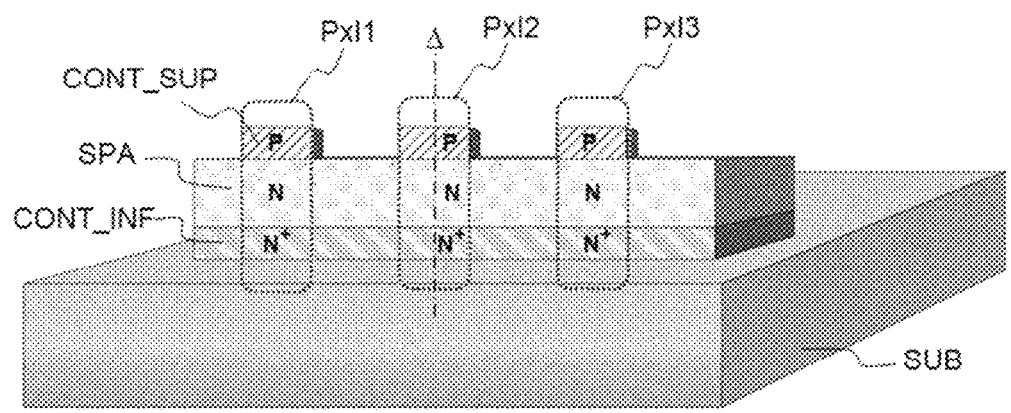
FIG. 1a illustrates a perspective view of a first example of a pixel belonging to a matrix detector in the infrared frequency range.

FIG. 1a illustrates a perspective view of one example of a pixel belonging to an infrared radiation matrix detector. The illustration is limited to a single pixel Pxl for the sake of simplification, but it does not exclude the pixel being integrated into a matrix comprising a plurality of juxtaposed pixels.

The pixel Pxl of an infrared detector is produced by a stack of layers made of semiconductor materials forming the structure of the pixel on a substrate SUB. The axis of the pixel Δ is the axis perpendicular to the horizontal plane (x,y) formed by the upper surface of the substrate SUB. The substrate SUB is made of a bulk III-V semiconductor material, for example. The choice of the material of the substrate SUB is important because it determines the technology of the steps of the fabrication process for the device, but also the technical (optical, electrical, mechanical, etc.) characteristics of the matrix detector. The pixel Pxl comprises the following layers, going from the substrate, in the direction of the axis of the pixel Δ: a lower contact structure CONT_INF, an absorbent planar structure SPA and an upper contact structure CONT_SUP.

The lower contact structure CONT_INF may be made of bulk N+-doped semiconductor material and has a maximum valence band energy level less than the maximum valence band energy level of the absorbent planar structure SPA. Preferably, the material forming the lower contact structure is an III-V material, such as, by way of example, gallium arsenide, indium arsenide, gallium nitride, gallium antimonide, boron phosphide, along with the ternary or quaternary or quinary alloys thereof. The lower contact CONT_INF may also be produced with heterostructures that are obtained by a stack of a plurality of thin layers of semiconductor materials, preferably III-V semiconductor materials, such as, by way of example, gallium arsenide, indium arsenide, gallium nitride, gallium antimonide, boron phosphide, along with the ternary or quaternary or quinary alloys thereof. The lower contact structure CONT_INF constitutes, by way of example, an N+-doped superlattice having a high energy gap value. Mention is made, by way of example, of the N+-doped InAS/InAsSb superlattice or the N+-doped InAs/InGaAsSb superlattice.

The absorbent planar structure SPA acts as absorbent region. It is made of bulk N-doped semiconductor material (or a superlattice-type heterostructure) having an energy gap value less than or equal to that of the lower contact structure. The characteristics of the band diagram of the absorbent planar structure SPA (valence band, conduction band, gap energy) are intrinsic in the case of a bulk material, or effective resulting from the combination of the various thin layers in the case of a superlattice. The absorbent planar structure SPA converts the flux of incident photons with a wavelength A into negative charge carriers "electrons" in the (intrinsic or effective) conduction band of the structure SPA and positive charge carriers "holes" in the (intrinsic or effective) valence band of the structure SPA. For the devices targeted by the invention, this is a photoelectric effect in which the minority charge carriers (the holes for N-doping) are used to generate the readout signal following stimulation of the absorbent planar structure SPA by infrared radiation. The semiconductor materials used to produce the absorbent planar structure SPA (in the form of a bulk material or superlattice) may be III-V semiconductor materials such as, by way of example, gallium arsenide, indium arsenide, gallium nitride, gallium antimonide, boron phosphide, along with the ternary or quaternary or quinary alloys thereof. The structure of the energy bands in the absorbent planar structure SPA is decisive for increasing the cutoff frequency of the matrix detector comprising the pixel Pxl.

The upper contact structure CONT_SUP is made of bulk P+-doped semiconductor materials generally having a high energy gap value. These materials are preferably III-V materials, such as, by way of example, gallium arsenide, indium arsenide, gallium nitride, gallium antimonide, boron phosphide, along with the ternary or quaternary or quinary alloys thereof. The upper contact CONT_SUP may also be produced with heterostructures that are obtained by a stack of a plurality of thin layers of semiconductor materials, preferably III-V semiconductor materials, such as, by way of example, gallium arsenide, indium arsenide, gallium nitride, gallium antimonide, boron phosphide, along with the ternary or quaternary or quinary alloys thereof. The upper contact structure CONT_SUP constitutes, by way of example, a P+-doped superlattice having a high energy gap value.

FIG. 1a illustrates a pixel having a structure obtained by successive deposition and etching operations. A pixel is thus delimited along the plane (x,y) by its three-dimensional structure obtained by the etching operations.

As an alternative, it is possible to produce the same architecture of the pixel along the axis of the pixel Δ but delimited along the plane (x,y) with doping regions and not a structure resulting from etching.

Figure 1B:
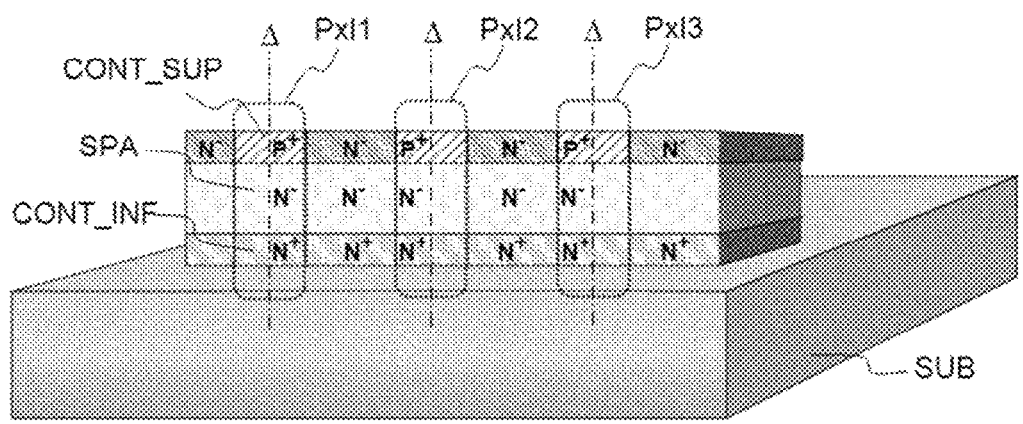
FIG. 1b illustrates a perspective view of a second example of a pixel belonging to a matrix detector in the infrared frequency range.

FIG. 1b illustrates a perspective view of a plurality of pixels belonging to a matrix detector in the infrared frequency range, delimited by the P+-doping regions of the upper contact CONT_SUP. The characteristics of the various parts of each pixel along its axis Δ remain the same compared to FIG. 1a. The major difference is the way in which the pixels are delimited in the matrix, resulting from the fabrication process used for the delimitation (etching in 1a and doping of the upper contact in 1b).

As indicated above, the choice of the compositions of the semiconductor alloys used to produce the planar absorption structure is decisive for obtaining the desired optimum point in terms of quantum efficiency, reducing crosstalk and reducing dark current.

To understand the invention, it is essential to understand the mechanism of growing a thin layer exhibiting lattice matching with a substrate. Generally speaking, a bulk material in the solid state is organized in a crystal structure obtained by spatially periodically repeating an elementary lattice formed by the atoms of said material. For a given material, all mechanical, physical and electrical characteristics are determined, inter alia, by the structure of the crystal lattice. For the case of an alloy of semiconductor materials, the choice of the molar fractions of the various materials forming the alloy defines the crystal structure and the geometric parameters of the crystal lattice of the alloy that is obtained.

In the case of infrared radiation detectors based on semiconductor thin layers, the layers that form the absorbent planar structure are fabricated via the process of epitaxy on a substrate. It is possible to use molecular beam epitaxy or organometallic vapor-phase epitaxy. In the case of a semiconductor alloy, the choice of the molar fractions used in the epitaxy step for each component of the alloy makes it possible to control the parameters of the crystal lattice of the layer that is deposited. Thus, with a careful choice of the molar fractions, it is possible to carry out epitaxial deposition of a thin layer exhibiting lattice matching with the crystal structure of the substrate. Reference is made here to hetero-epitaxy.

If the molar fractions used in the alloy deposited on the substrate are different from the values corresponding to a lattice match, it is possible to grow layers of semiconductor alloy of a few nanometers on the substrate. Indeed, the crystal lattices of a deposited layer will adapt to the crystal lattice of the substrate during the epitaxy operation while experiencing internal mechanical stresses. The internal mechanical stresses may be tensile or compressive stresses depending on the chosen molar fractions for the alloy. At the scale of the crystal lattice, the internal mechanical stresses experienced by the crystal lattices of the deposited layer lead to asymmetries in said lattices and modifications of the electromagnetic forces between the atoms. From an electrical point of view, this leads to a modification of the energy band structure in the deposited layer.

Generally speaking, in a stack of layers deposited epitaxially on a substrate, a distinction is drawn between two types of dislocations that may occur in the crystal lattice of the deposited layers: substrate dislocations and relaxation dislocations.

Substrate dislocations result from intrinsic dislocations in the crystal lattice of the substrate with a dislocation volume density that depends on the fabrication process of the substrate. Substrate dislocations comprise dislocations characterized by their Burgers vector tilted with respect to the interface by an angle of 60°. The 60° dislocations are able to propagate in the volume of the stack to the surface of the epitaxially deposited layer. Reference is made to emergent dislocations or threading dislocations. Substrate dislocations have a volume density of the order of 1 to $10^4$ dislocations/cm2 depending on the maturity of the technological process.

By way of example, the volume density of substrate dislocations present in an InP substrate are less than $5 \cdot 10^3$ dislocations/cm2.

Relaxation dislocations are dislocations related to the lattice mismatch between an epitaxially deposited layer and the substrate SUB. Indeed, when the internal stresses applied to the lattices of the deposited layer exceed a threshold value, there is a phenomenon of mechanical relaxation of some of the lattices. The elastic energy of the lattices of the stack of layers is no longer able to withstand the stress, and a plurality of emergent and non-emergent relaxation dislocations occurs in the volume of the crystal lattice. This phenomenon is then determined indirectly by the chosen composition of the epitaxially deposited alloys with respect to the substrate. In the case of exceeding the relaxation limit stress, the volume density of dislocations becomes of the order of $10^7$ to $10^{10}$ dislocations/cm2. In the case of the epitaxially produced infrared detector, the mechanical relaxation leads to dislocations that propagate in the volume of the absorption structure, mechanically weakening the entire structure of the pixel and degrading the electro-optical performance of the pixel.

In the following paragraphs, we will describe the various embodiments of the invention.

Figure 2A:
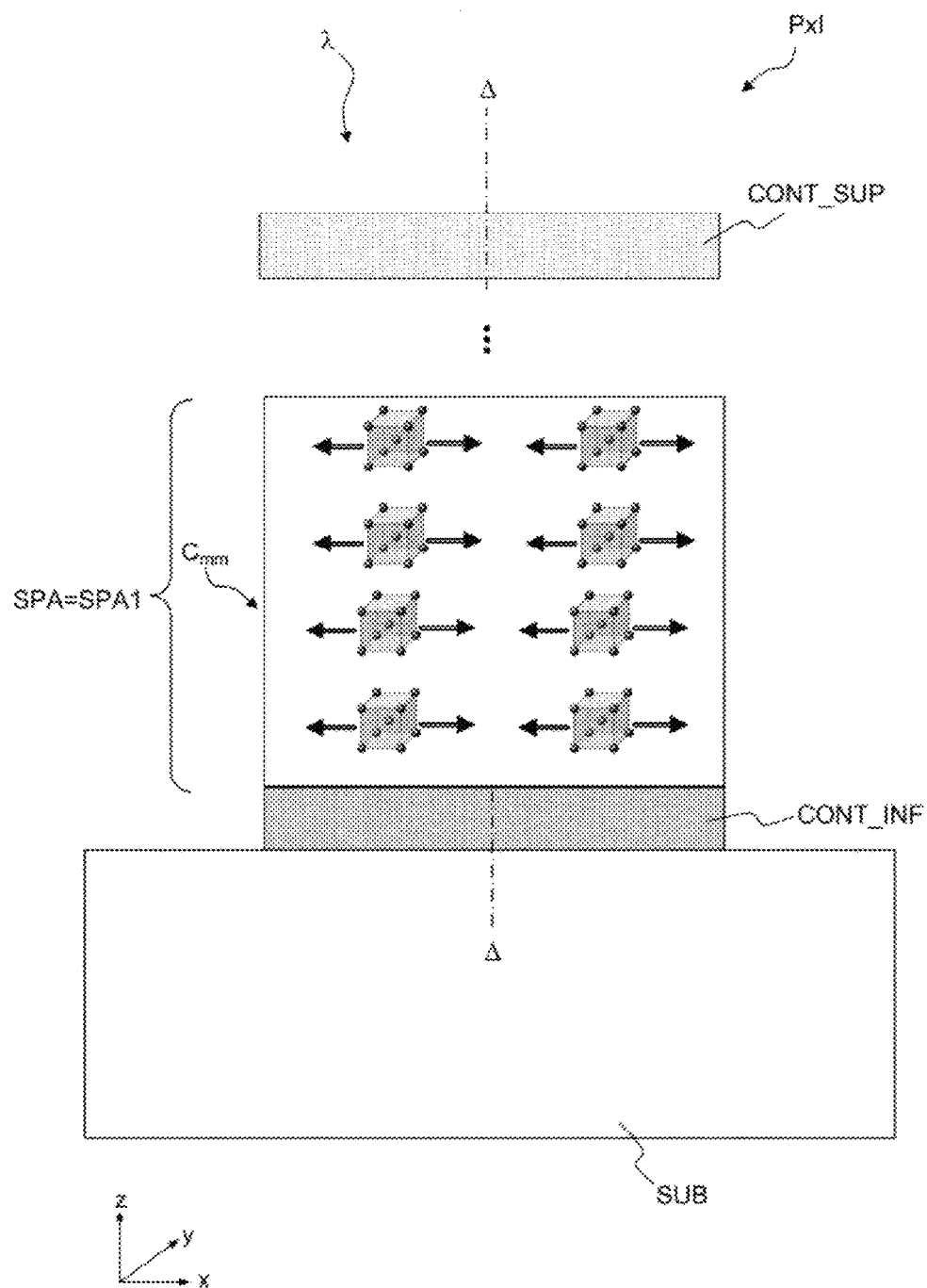
FIG. 2a illustrates a sectional view of an infrared detector pixel comprising a planar absorption structure according to a first embodiment of the invention.

FIG. 2a illustrates a sectional view of an infrared detector pixel comprising a planar absorption structure according to a first embodiment of the invention. In this case, this is a planar absorption structure produced with a layer of bulk material $C_{mm}$.

The layer of bulk material $C_{mm}$ is deposited epitaxially on the substrate SUB with a mismatch of the lattice parameters leading to internal stresses on the lattices of the absorbent layer $C_{mm}$, as shown by the arrows in FIG. 2a. The layer of bulk material $C_{mm}$ is N-doped, and it is the minority charge carriers that form the photogenerated electrical signal. In addition, the internal stresses experienced by the lattices lead to a quantum phenomenon known by the term "degeneracy lifting".

"Degeneracy lifting" consists of a separation of the energy level of the valence band referred to as "heavy hole" and that referred to as "light hole" at k=0. A valence band is referred to as "heavy hole" when its dispersion relation is weak. A valence band is referred to as "light hole" when its dispersion relation is strong. A valence band referred to as "heavy hole" is thus occupied by heavy holes, and a valence band referred to as "light hole" is occupied by light holes. In a semiconductor material, light holes have an effective mass $m_{lh}$ much less than that of heavy holes, denoted $m_{hh}$. This thus gives, in the layer of bulk material $C_{mm}$ at k=0, the distinction between a maximum energy level of the valence band occupied by heavy holes and a maximum energy level of the valence band occupied by light holes. In addition, a modification of the position of the conduction band and valence bands occurs under the effect of stress. When this is a tensile stress, the energy gap decreases (minimum of the conduction band decreases and maximum of the valence band increases). When this is a compressive stress, the energy gap increases (minimum of the conduction band increases and maximum of the valence band decreases).

The layer of bulk N-doped material $C_{mm}$ is formed of an alloy of III-V semiconductor materials, and the molar fractions are chosen such that the stress resulting from the sum of the internal mechanical stresses is a tensile stress. This overall tensile stress on the whole of the layer of bulk material leads to the obtaining of a valence band referred to as "light hole", with the highest energy along the axis of the pixel, and a valence band referred to as "heavy hole", with the highest energy along the normal plane (x,y). There is generation of an asymmetry between: the effective mass of the holes along the axis of the pixel $m_z$, mostly light holes, on the one hand, and the effective mass of the holes along the plane normal to the pixel $m_{x,y}$, mostly heavy holes, on the other hand. The asymmetry in effective masses (and therefore in mobility) leads to mobility of the holes along the axis of the pixel greater than in the normal plane (x,y).

The low effective mass $m_z$ of the minority charge carriers in the planar absorption structure along the axis of the pixel Δ ensures better quantum efficiency of the detector pixel Pxl. The mobility of the positive charge carriers along the axis of the pixel in the absorption structure of the first embodiment is multiplied by 20 compared to a structure in which there is no inversion between the energy levels of the heavy holes and the light holes.

The large effective mass $m_{x,y}$ of the minority charge carriers in the planar absorption structure in the normal plane (x,y) reduces the phenomenon of crosstalk between adjacent pixels. The asymmetry between the effective masses of the holes makes it possible to reduce crosstalk for inter-pixel distances less than 15 μm.

Figure 2B:
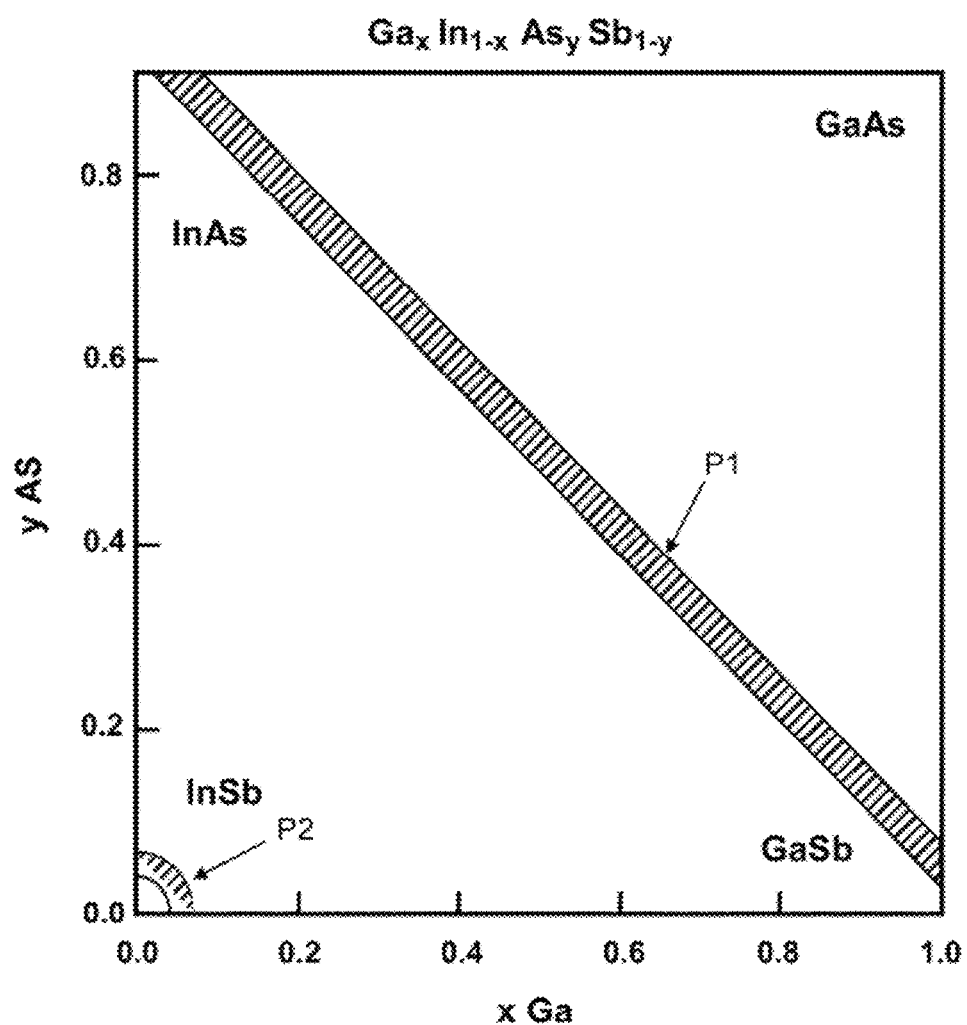
FIG. 2b illustrates ranges of values of molar fractions for the choice of the compositions of materials of the planar absorption structure according to the first embodiment of the invention.

FIG. 2b illustrates ranges of values of molar fractions used for the choice of the compositions of materials of the planar absorption structure according to the first embodiment of the invention.

The planar absorption structure SPA having the features detailed above may be obtained by depositing a layer $C_{mm}$ formed with the alloy $Ga_xIn_{1-x}As_ySb_{1-y}$ on a GaSb substrate. x1 denotes the molar fraction of gallium Ga in the alloy $Ga_xIn_{1-x}As_ySb_{1-y}$, and y1 denotes the molar fraction y of arsenic As in the alloy $Ga_xIn_{1-x}As_ySb_{1-y}$. All of the pairs of molar fractions (x1,y1) define the surface P1 described in the diagram of FIG. 2b, corresponding to the range of compositions that make it possible to obtain a planar absorption structure SPA with:

The overall stress on the lattices of the layer $C_{mm}$ is a tensile stress.

An asymmetry between the valence band along the axis of the pixel having a maximum energy level occupied by light holes and the valence band along the plane (x,y) having a maximum energy level occupied by heavy holes.

A low density of dislocations by virtue of the absence of relaxation dislocations.

The composition range P1 is defined by the following rules:

the molar fraction x1 of gallium Ga in the alloy $Ga_{x1}In_{1-x1}As_{y1}Sb_{1-y1}$ is between 0 and 1;

$$0 \leq x1 \leq 1$$

and the molar fraction y1 of arsenic As in the alloy $Ga_{x1}In_{1-x1}As_{y1}Sb_{1-y1}$ is between a minimum value $y1_{min}$ and a maximum value $y1_{max}$ such that:

$$y1_{min} \leq y1 \leq y1_{max}$$

the minimum value $y1_{min}$ of the molar fraction y1 of arsenic As in the alloy $Ga_{x1}In_{1-x1}As_{y1}Sb_{1-y1}$ is an affine function of the molar fraction x1 of gallium Ga in the alloy $Ga_{x1}In_{1-x1}As_{y1}Sb_{1-y1}$ characterized by a leading coefficient equal to −0.92 and an ordinate at the origin equal to 0.93;

$$y1_{min} = -0.92x1 + 0.93$$

the maximum value $y1_{max}$ of the molar fraction y1 of arsenic As in the alloy $Ga_{x1}In_{1-x1}As_{y1}Sb_{1-y1}$ is an affine function of the molar fraction x1 of gallium Ga in the alloy $Ga_{x1}In_{1-x1}As_{y1}Sb_{1-y1}$ characterized by a leading coefficient equal to −0.92 and an ordinate at the origin equal to 0.97.

$$y1_{max} = -0.92x1 + 0.97$$

As an alternative, the planar absorption structure SPA having the features detailed above may be obtained by depositing a layer $C_{mm}$ produced with the alloy $Ga_xIn_{1-x}As_ySb_{1-y}$ on an InSb substrate. All of the pairs of molar fractions (x2,y2) define the disk arc P2 described in the diagram of FIG. 2b, corresponding to the range of compositions that make it possible to obtain a planar absorption structure SPA on an InSb substrate with:

The overall stress on the lattices of the layer $C_{mm}$ is a tensile stress.

An asymmetry between the valence band along the axis of the pixel having a maximum energy level occupied by light holes and the valence band along the plane (x,y) having a maximum energy level occupied by heavy holes.

A low density of dislocations by virtue of the absence of relaxation dislocations.

The composition range P2 is defined by the following rules:

the molar fraction x2 of gallium Ga in the alloy $Ga_{x2}In_{1-x2}As_{y2}Sb_{1-y2}$ is between 0.02 and 0.05, $$0.02 \leq x2 \leq 0.05$$

and the molar fraction y2 of arsenic As in the alloy $Ga_xIn_{1-x1}As_{y1}Sb_{1-y1}$ is between 0.02 and 0.05.

$$0.02 \leq y2 \leq 0.05$$

The choice of the molar fractions in the ranges P1 or P2 depending on the substrate that is used makes it possible to obtain an absorbent planar structure SPA under a tensile stress, denoted $c_{tot}$, without exceeding the limit value of 4000 ppm, which may lead to relaxation of the material of the layer $C_{mm}$.

$$c_{tot} \leq 4000 \text{ ppm}$$

The tensile stress for the choices of alloys belonging to the range P1 on a GaSb substrate is between 800 ppm and 4000 ppm. The tensile stress for the choices of alloys belonging to the range P2 on an InSb substrate is between 500 ppm and 4000 ppm.

Figure 2C:
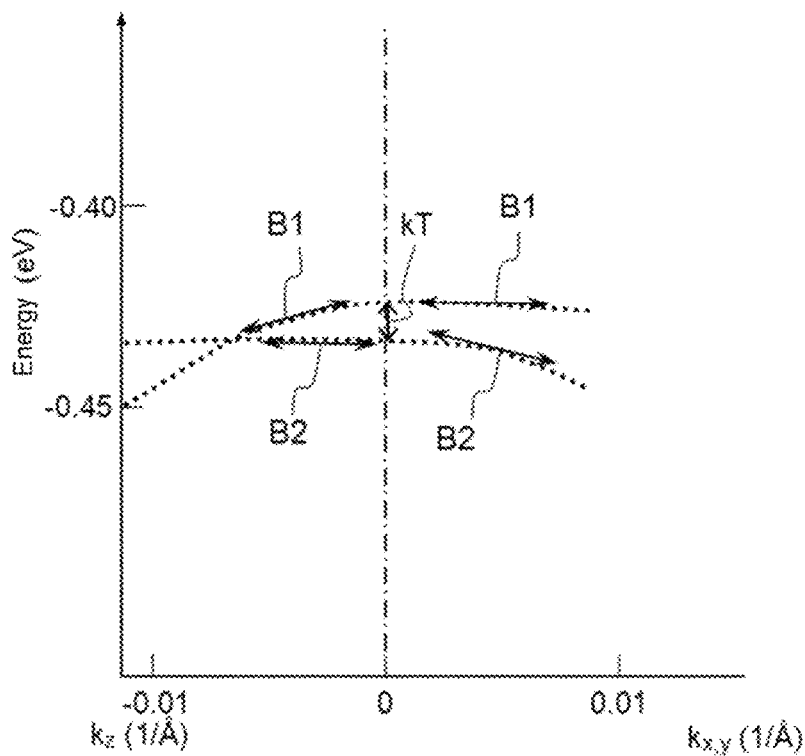
FIG. 2c illustrates a simulated band diagram of the absorbent planar structure according to the first embodiment of the invention in the three directions of the reciprocal vector space.

FIG. 2c illustrates a simulated band diagram of one example of the absorbent planar structure according to the first embodiment of the invention in the three directions of the reciprocal vector space defined by k, the wave vector in a semiconductor material. More specifically, the simulated diagram in FIG. 2c illustrates the band diagram of a layer $C_{mm}$ made of $Ga_{0.05}In_{0.95}As_{0.885}Sb_{0.115}$ on a GaSb substrate.

Under these conditions, the absorbent planar structure SPA experiences a tensile stress of the order of 1000 ppm. The density of dislocations in the absorbent structure SPA according to the first embodiment is of the order of $10^3$ dislocations/cm2 since there is no relaxation of the materials. The absorbent planar structure SPA with this exemplary composition makes it possible to achieve a cutoff wavelength of λc=4.2 μm at an operating temperature of T=150 K with an effective mass of holes along the axis of the pixel $m_z$=0.02 $m_0$ and an effective mass of holes in the normal plane of the pixel $m_{x,y}$=0.4 $m_0$, where $m_0$ is the effective mass of a free electron.

For each energy level in the valence band, the effective mass of the holes in the band diagram is inversely proportional to the slope of the variation of the energy level in the reciprocal vector space. It is thus observed on the diagram that, in the direction z (axis of the pixel), the maximum energy level of the valence band is occupied by light holes ($Ev_{lh}$). The energy gap $\Delta_{lh\text{-}hh}$ between the maximum energy level B1 occupied by light holes $Ev_{lh}$ and the level of heavy holes $Ev_{hh}$ is of the order of $k_b T$, where $k_b$ is the Boltzmann constant and T is the operating temperature. All of the combinations of compositions contained within the surface P1 or P2 (depending on the substrate) make it possible to obtain values of $\Delta_{lh\text{-}hh}$ of the order of $k_b T$ or more depending on the targeted operating temperature and the targeted cutoff frequency.

When looking at the band diagram in the directions kx and ky corresponding to the normal plane of the pixel, it is an inverse distribution of the holes that is obtained. Indeed, the maximum energy level B1 of the valence band along the plane normal to the pixel (x,y) is occupied by heavy holes (with a flatter slope).

This thus gives the asymmetry between the mobility of the minority charge carriers (holes in this case) between the axis of the pixel and the plane normal to the pixel, making it possible to reduce the crosstalk phenomenon without reducing the quantum efficiency of the absorbent region.

Figure 2D:
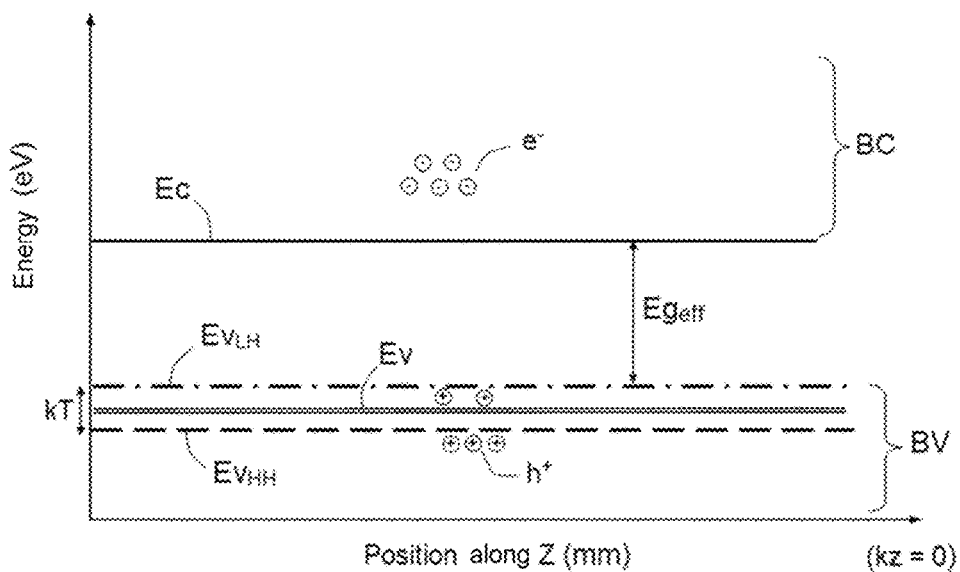
FIG. 2d illustrates a diagram of the structure of the bands of the absorbent planar structure according to the first embodiment of the invention in the direction of the axis of the pixel at $k_z=0$.

FIG. 2d generally illustrates a diagram of the structure of the bands of the absorbent planar structure SPA according to the first embodiment of the invention in the direction of the axis of the pixel with $k_z=0$.

The layer $C_{mm}$ is under tensile stress and the phenomenon of degeneracy lifting is observed by the distinction of the maximum energy level of heavy holes $Ev_{hh}$ and the maximum energy level of light holes $Ev_{lh}$ with a gap of $k_b T$. This distribution promotes the circulation of light holes since the creation of electron-hole pairs through the photoelectric effect by photonic stimulation requires a lower energy for light holes.

In the following paragraph, we will give some examples of preferred compositions according to the first embodiment on a GaSb substrate according to the targeted cutoff frequency and the targeted operating temperature:

For $\lambda c=1.9$ µm and T between 250 K and 300 K: $C_{mm}$ is made of $Ga_x In_{1-x} As_y Sb_{1-y}$, with $0.95 \leq x \leq 0.98$ and $0.04 \leq y \leq 0.08$;

For $\lambda c=2.5$ µm and T between 250 K and 300 K: $C_{mm}$ is made of $Ga_x In_{1-x} As_y Sb_{1-y}$, with $0.785 \leq x \leq 0.84$ and $0.17 \leq y \leq 0.22$;

For $\lambda c=4.2$ µm and T=150 K: $C_{mm}$ is made of $Ga_x In_{1-x} As_y Sb_{1-y}$, with $0.03 \leq x \leq 0.07$ and $0.86 \leq y \leq 0.9$.

In the following section, we will describe the second embodiment of the invention based on a planar absorption structure produced by a superlattice.

Figure 3A:
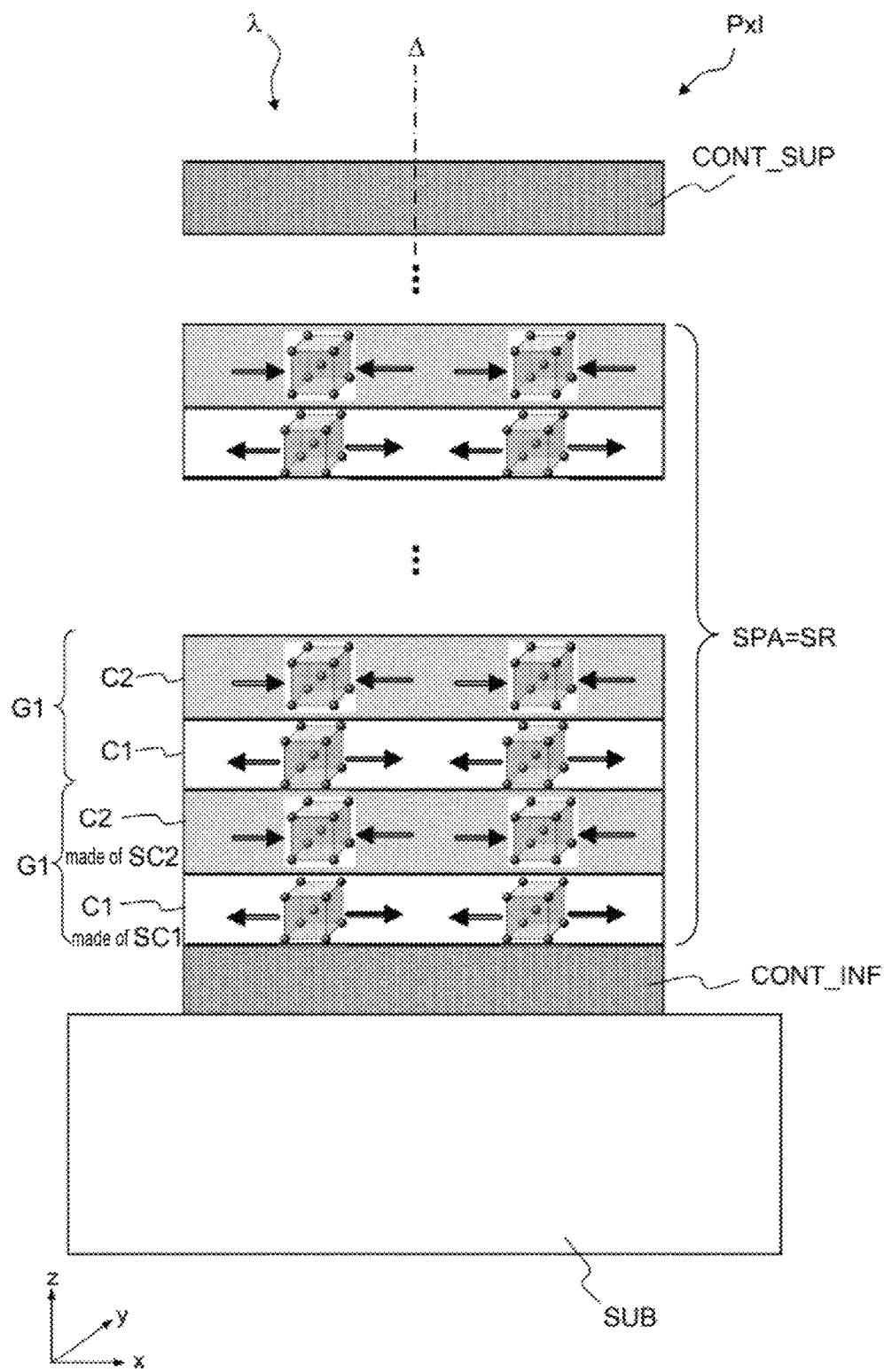
FIG. 3a illustrates a sectional view of an infrared detector pixel comprising a planar absorption structure according to a second embodiment of the invention.

FIG. 3a illustrates a sectional view of an infrared detector pixel comprising a planar absorption structure according to a second embodiment of the invention based on a superlattice SR.

The planar absorption structure SPA is produced in this illustration via a periodic heterostructure that forms the superlattice SR. Generally speaking, the superlattice SR is a periodic stack of an elementary group G1 formed by a plurality of thin layers made of semiconductor materials. In this example, the elementary group is formed by the first layer C1 having a thickness e1 and the second layer C2 having a thickness e2. The period of the superlattice is thus equal to e1+e2. From a quantum point of view, if the layers C1 and C1 are sufficiently thin (between 0.3 nm for an atomic monolayer and 10 nm), a quantum coupling phenomenon is obtained at the various junctions at the interfaces of the layers. This quantum coupling allows charge carriers to access new energy mini-bands. This is tantamount to obtaining a resulting energy band diagram different from that of the bulk materials forming the superlattice SR. In the remainder of the text of this application, the energy band diagram resulting from the association of the thin layers G1=(C1, C1) forming the superlattice SR is denoted by the "effective band diagram".

The effective band diagram is defined by:
an effective conduction band, $BC_{eff}$, having a minimum energy value $Ec_{eff}$;
an effective valence band, $BV_{eff}$, having a maximum energy value $Ev_{eff}$;
an effective energy gap $Eg_{eff}$ equal to the difference between the minimum energy value of the conduction band $Ec_{eff}$ and the maximum energy value $Ev_{eff}$.

Generally speaking, the use of superlattices in the absorbent planar structures of a pixel makes it possible to achieve cutoff frequencies that are not accessible with absorption regions based on bulk materials. The design choices of the absorbent planar structure SPA cover, without limitation, the composition of the materials used (engineering of the materials), the use of a structure with bulk material or a superlattice and the thicknesses of layers that are used (structural design of the device). These design choices open up possibilities for improving the quantum efficiency of the pixel and limiting crosstalk noise between adjacent pixels.

To implement the second embodiment of the invention, for each elementary group G1 of the superlattice SR:

The layer C1 is produced by a first semiconductor material SC1 having a first conduction band minimum value Ec1; a first valence band maximum value Ev1 and a first energy gap value Eg1.

The second layer C2 is made of a second semiconductor material SC2 having a second conduction band minimum value Ec2 strictly less than the first conduction band minimum value Ec1; a second valence band maximum value Ev2 strictly less than the first valence band maximum value Ev1 and a second energy gap value Eg2.

The lattices of each layer C1 experience tensile stresses, the lattices of each layer C2 experience compressive stresses, and the stress resulting from the sum of the internal mechanical stresses for each elementary group G1 is a tensile stress.

Generally speaking, the same electrical and mechanical characteristics of the first embodiment with a layer $C_{mm}$ made of bulk material are obtained with the second embodiment with a superlattice SR.

Figure 3B:
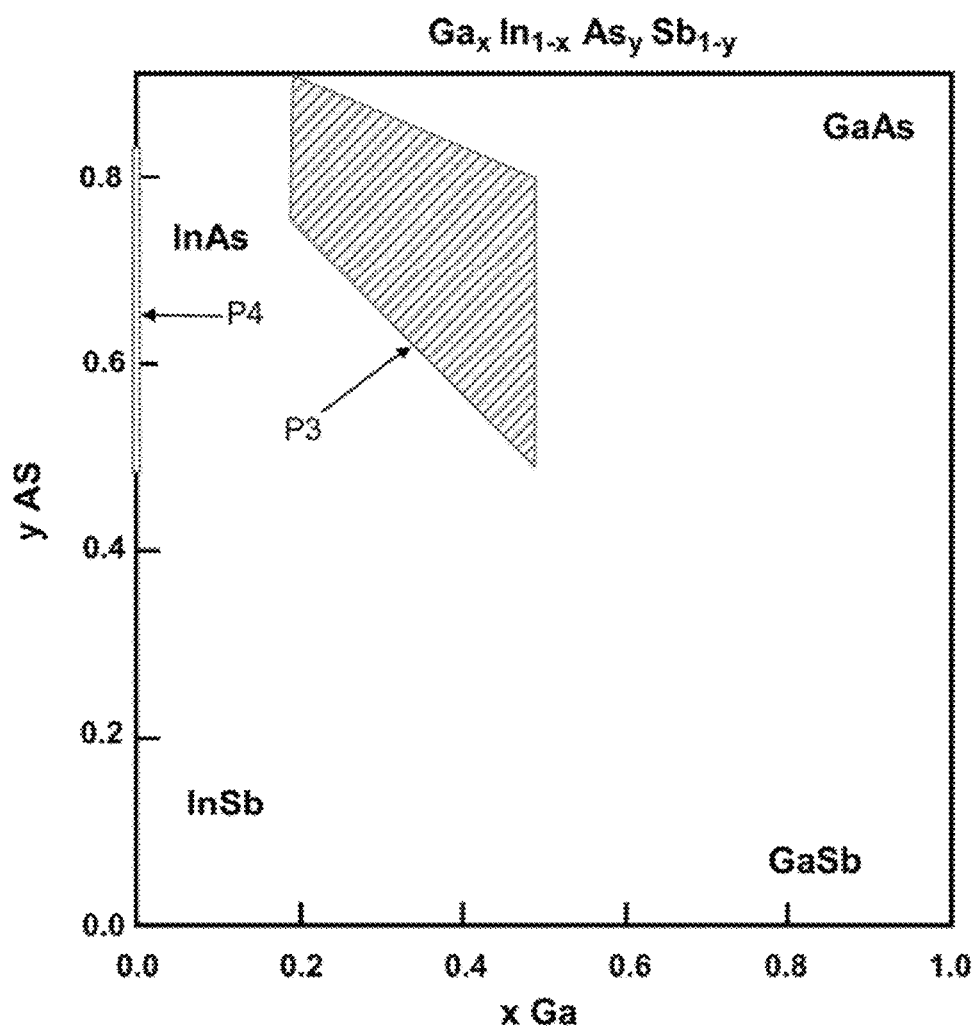
FIG. 3b illustrates ranges of values of molar fractions for the choice of the compositions of materials of the planar absorption structure according to the second embodiment of the invention.

FIG. 3b illustrates ranges of values of molar fractions used for the choice of the compositions of materials of the layers C1 and C2 of the planar absorption structure SPA according to the second embodiment of the invention.

The planar absorption structure SPA having the characteristics detailed above may be obtained by fabricating a superlattice SR on a GaSb substrate with an elementary group G1=(C1, C2) such that the second layer C2 is produced with the alloy $InAs_{y3}Sb_{1-y3}$, where y3 is the molar fraction of arsenic in the alloy $InAs_{y3}Sb_{1-y3}$ between 0.6 and 0.88 (range P4 on the composition diagram).

$$0.6 \leq y3 \leq 0.88$$

In addition, the first layer C1 is produced with the alloy $Ga_{x3}In_{1-x3}As_{y4}Sb_{1-y4}$. x3 denotes the molar fraction of gallium Ga in the alloy $Ga_{x3}In_{1-x3}As_{y4}Sb_{1-y4}$ and y4 denotes the molar fraction y of arsenic As in the alloy $Ga_{x3}In_{1-x3}As_{y4}Sb_{1-y4}$. All of the pairs of molar fractions (x3, y4) define the surface P3 described in the diagram of FIG. 3b.

The composition range P3 is defined by the following inequalities:
the molar fraction x3 of gallium Ga in the alloy $Ga_{x3}In_{1-x3}As_{y4}Sb_{1-y4}$ is between 0.2 and 0.5;

$$0.2 \leq x3 \leq 0.5$$

and the molar fraction y4 of arsenic As in the alloy $Ga_{x3}In_{1-x3}As_{y4}Sb_{1-y4}$ is between a minimum value $y4_{min}$ and a maximum value $y4_{max}$ such that:

$$y4_{min} \leq y4 \leq y4_{max}$$

the minimum value $y4_{min}$ of the molar fraction y4 of arsenic As in the alloy $Ga_{x3}In_{1-x3}As_{y4}Sb_{1-y4}$ is an affine function of the molar fraction x3 of gallium Ga in the alloy $Ga_{x3}In_{1-x3}As_{y4}Sb_{1-y4}$ characterized by a leading coefficient equal to −0.92 and an ordinate at the origin equal to 0.93;

$$y4_{min} = -0.92x3 + 0.93$$

the maximum value $y4_{max}$ of the molar fraction y3 of arsenic As in the alloy $Ga_{x3}In_{1-x3}As_{y4}Sb_{1-y4}$ is an affine function of the molar fraction x3 of gallium Ga in the alloy $Ga_{x3}In_{1-x3}As_{y4}Sb_{1-y4}$ characterized by a leading coefficient equal to −0.66 and an ordinate at the origin equal to 1.13.

$$y4_{max} = -0.66x1 + 1.13$$

For the layers C1 and C2, the ranges of compositions (x3,y4) for C1 and y3 for C2 taken from the ranges P3 and P4 make it possible to obtain a planar absorption structure SPA with:
The overall stress on the lattices of the elementary group G1=(C1, C2) is a tensile stress.
An asymmetry between the valence band along the axis of the pixel having a maximum energy level occupied by light holes and the valence band along the plane (x,y) having a maximum energy level occupied by heavy holes.
A low density of dislocations by virtue of the absence of relaxation dislocations.

The choice of the molar fractions within the ranges P3 and P4 for the superlattice SR makes it possible to obtain an absorbent planar structure SPA formed by the repetition of elementary groups G1 such that each group is under a tensile stress without exceeding the limit value of 4000 ppm, which may lead to relaxation of the materials of the layers C1 and C2. The stresses and the thicknesses of each layer C1, C2 of the elementary group G1 must comply with the following inequality in order to avoid relaxation dislocation phenomena:

$$\frac{\sum_i ei.ci}{\sum_i ei} \leq 4000 \; ppm$$

where $e_i$ is the thickness of the $i^{th}$ layer Ci of the elementary group G1, and $c_i$ is the stress experienced by the lattices of the $i^{th}$ layer $C_i$ of the elementary group G1. The density of dislocations in the absorbent structure SPA according to the second embodiment is of the order of $10^3$ dislocations/cm2 since there is no relaxation of the materials.

To take account of this inequality with the ranges of compositions detailed in FIG. 3b, it is conceivable to choose the thickness e1 of the first layer C1 between 3 nm and 6 nm and the thickness e2 of the second layer C2 between 0.9 nm and 2 nm. The low thickness values make it possible, for each layer Ci of the elementary group G1, to climb to stresses that may reach an amplitude of 20000 ppm for each layer Ci individually.

Figure 3C:
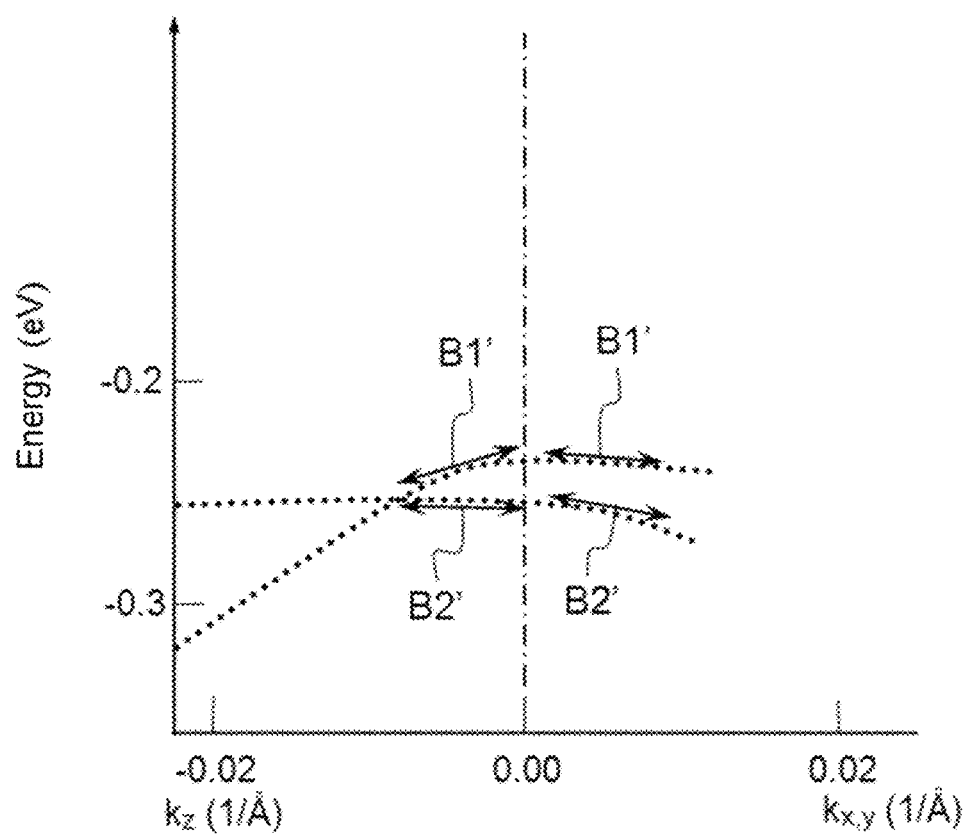
FIG. 3c illustrates a simulated mini-band diagram of the absorbent planar structure according to the second embodiment of the invention in the three directions of the reciprocal vector space at $k_z=0$.

FIG. 3c illustrates a simulated band diagram of one example of the absorbent planar structure according to the second embodiment of the invention in the three directions of the reciprocal vector space defined by k, the wave vector in a semiconductor material. More specifically, the simulated diagram in FIG. 3c illustrates the band diagram of the superlattice SR with C1 made of $Ga_{0.26}In_{0.74}As_{0.72}Sb_{0.28}$ and C2 made of $InAs_{0.85}Sb_{0.15}$ made of In on a GaSb substrate.

Under these conditions, the absorbent planar structure SPA experiences a tensile stress of the order of 1000 ppm. The absorbent planar structure SPA with this exemplary composition makes it possible to achieve a cutoff wavelength of λc=5 μm at an operating temperature of T=150 K with an effective mass of holes along the axis of the pixel $m_z=0.02 \; m_0$ and an effective mass of holes in the normal plane of the pixel $m_{x,y}=0.4 \; m_0$, where $m_0$ is the effective mass of a free electron.

For each energy level in the valence band, the effective mass of the holes in the band diagram is inversely proportional to the slope of the variation of the energy level in the reciprocal vector space. Similarly to FIG. 2c, it is thus observed on the diagram that, in the direction z (axis of the pixel), the maximum energy level of the valence band is occupied by light holes. The energy gap $\Delta_{lh-hh}$ between the maximum energy level B'1 occupied by light holes and the level of heavy holes is of the order of $k_bT$, where $k_b$ is the Boltzmann constant and T is the operating temperature. All of the combinations of compositions taken from the intervals P3 for C1 and P4 for C2 make it possible to obtain values of $\Delta_{lh-hh}$ of the order of $k_bT$ depending on the targeted operating temperature and the targeted cutoff frequency.

Similarly, when looking at the band diagram in the directions kx and ky corresponding to the normal plane of the pixel, it is an inverse distribution of the holes that is obtained. Indeed, the maximum energy level B'1 of the valence band along the plane normal to the pixel (x,y) is occupied by heavy holes (with a flatter slope).

This thus gives the asymmetry between the mobility of the minority charge carriers (holes in this case) between the axis of the pixel and the plane normal to the pixel, making it possible to reduce the crosstalk phenomenon without reducing the quantum efficiency of the absorbent region.

Figure 3D:
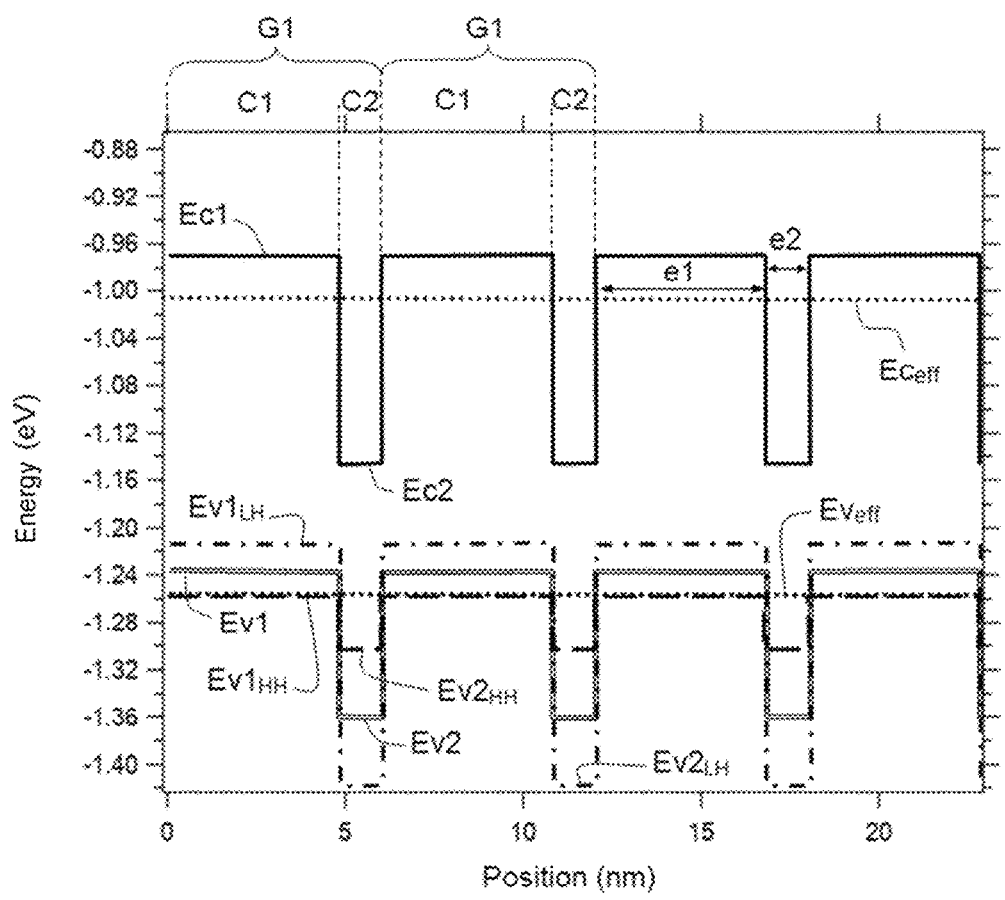
FIG. 3d illustrates a diagram of the structure of the bands of the absorbent planar structure according to the second embodiment of the invention in the direction of the axis of the pixel.

FIG. 3d illustrates a diagram of the structure of the bands of the absorbent planar structure SPA according to the second embodiment of the invention in the direction of the axis of the pixel with $k_z=0$.

The materials that form the superlattice are chosen such that Ec1>Ec2 and Ev1>Ev2 so as to obtain a type 2 potential diagram. This involves an alternation of potential barriers in the second layers C2 and potential wells in the first layers C1 seen by positive charge carriers. This also involves an alternation of potential barriers in the first layers C1 and potential wells in the second layers C2 seen by negative charge carriers.

As indicated above, quantum coupling between the various layers of the superlattice leads to the creation of an effective conduction band with an effective minimum energy level $Ec_{eff}$ and an effective valence band with an effective maximum energy level $Ev_{eff}$. The effective energy gap of the superlattice is defined by $Eg_{eff}=Ec_{eff}-Ev_{eff}$.

The potential barrier BAR seen by the holes confined in a potential well in a type 2 band heterostructure is defined by the difference between the effective maximum energy level $Ev_{eff}$ of the valence mini-band of the superlattice SR and the energy maximum of the valence band occupied by heavy holes in the layer C2 denoted $Ev2_{hh}$;

$$BAR = Ev_{eff} - Ev2_{hh}$$

β is defined as the product of the potential barrier BAR and the thickness e2 of the layer C2 corresponding to the barrier thickness seen by a hole in the volume of the superlattice SR.

$$\beta = e2 \cdot Bar$$

The product β constitutes a criterion for ensuring good quantum efficiency of the absorbent planar structure with a superlattice according to the invention. Optical efficiency increases when the product β decreases. The materials that form the superlattice SR are chosen such that β is less than the limit value of 250 nm·meV.

The low effective mass $m_z$ of the minority charge carriers along the axis of the pixel Δ in the planar absorption structure with a superlattice SR as described ensures better quantum efficiency of the detector pixel Pxl. The effective mass of the positive charge carriers along the axis of the pixel in the absorption structure of the first embodiment is multiplied by 50 compared to a structure in which there is no inversion between the energy levels of the heavy holes and the light holes.

The large effective mass $m_{x,y}$ of the minority charge carriers in the planar absorption structure in the normal plane (x,y) reduces the phenomenon of crosstalk between adjacent pixels. The asymmetry between the effective masses of the holes makes it possible to reduce crosstalk for inter-pixel distances less than 15 μm.

The various embodiments of the planar absorption structure SPA are compatible with overall pixel architectures that make it possible to implement the improvement in quantum efficiency and the reduction in crosstalk, but also the reduction in dark current.

Figure 4A:
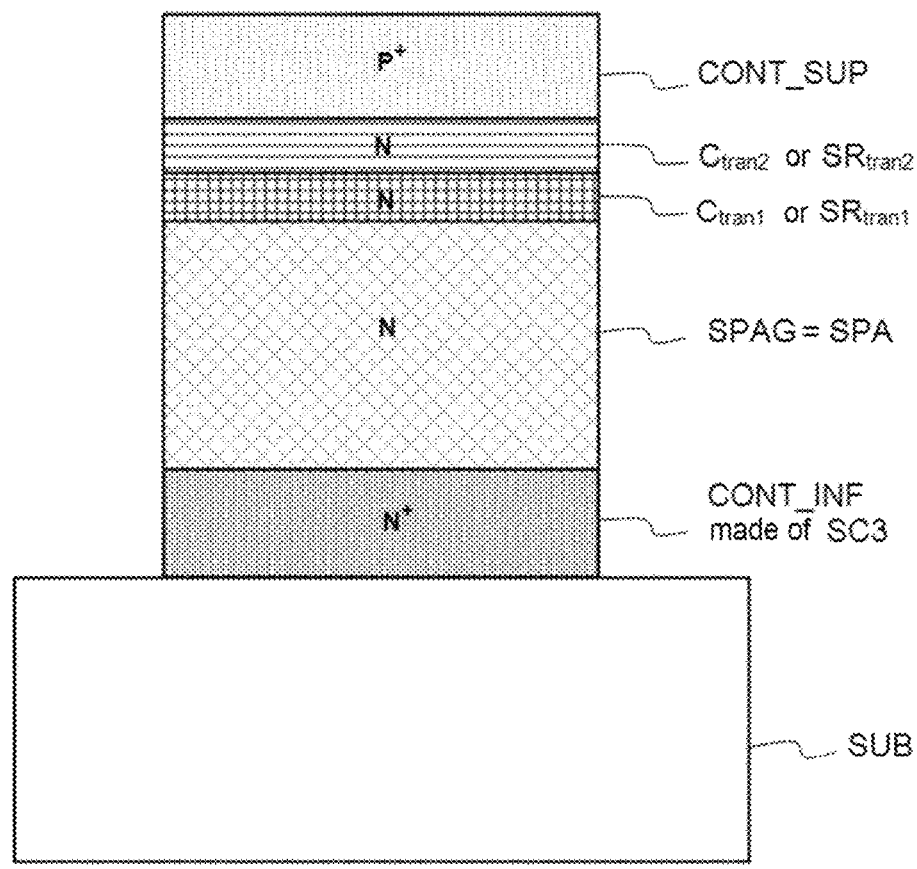
FIG. 4a illustrates a sectional view of a first example of a pixel comprising an absorbent planar structure according to any one of the embodiments of the invention.
Figure 4B:
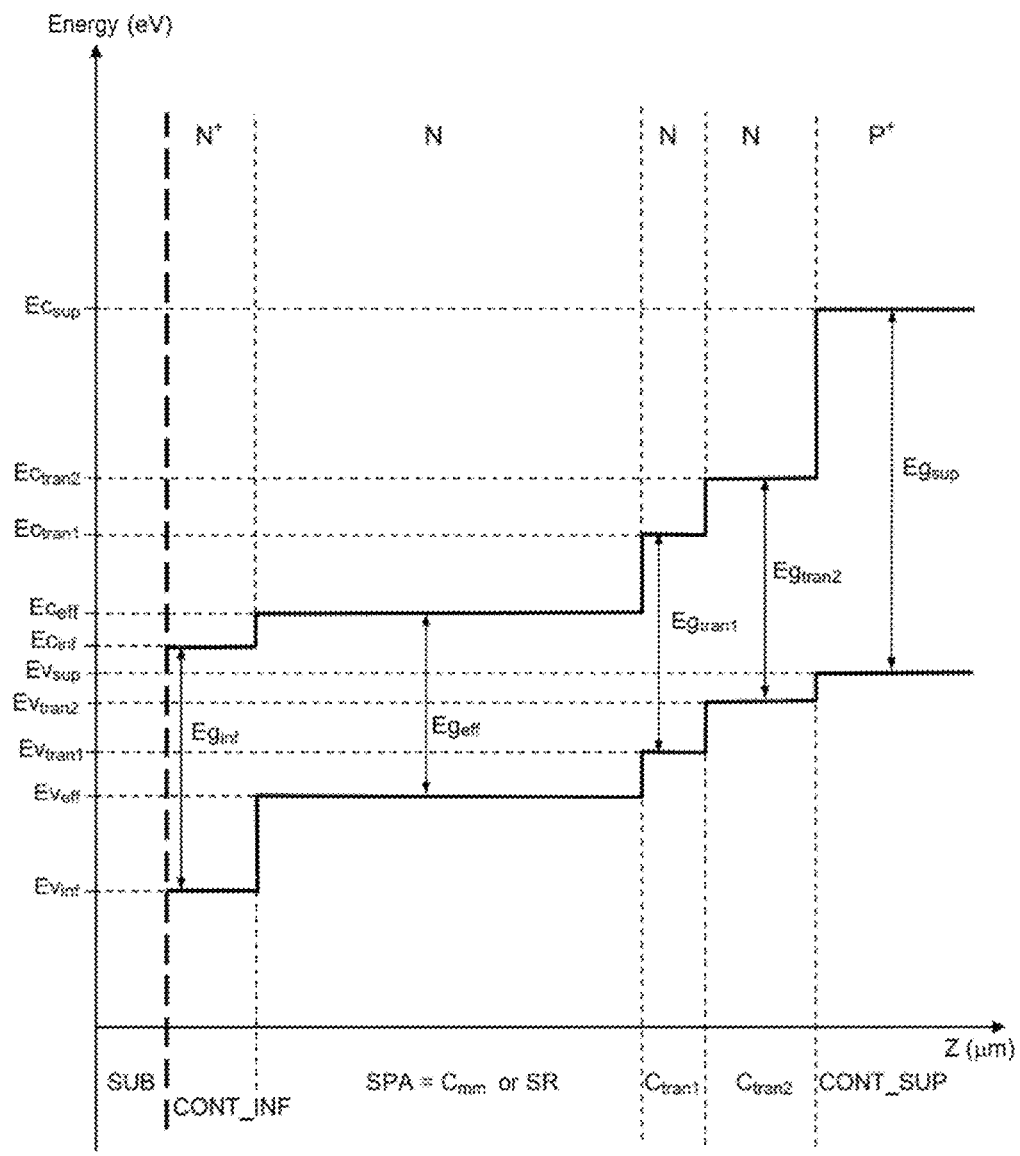

FIG. 4a illustrates a sectional view of a first example of a pixel comprising an absorbent planar structure according to any one of the embodiments of the invention. FIG. 4b illustrates a diagram of the band structure along the axis of the pixel of FIG. 4a.

The pixel Pxl comprises, along the stacking direction Z (or the axis of the pixel) and in this order: the substrate SUB having the characteristics detailed above, a lower contact structure CONT_INF made of a third N+-doped semiconductor material SC3, an absorbent planar structure SPA according to the invention with the layer $C_{mm}$ or the N-doped layers C1, C2; a series of two transition structures $C_{tran1}$ and $C_{tran2}$ each made of a semiconductor material SC4; and an upper contact structure CONT_SUP made of a fifth P-doped semiconductor material SC5.

The lower contact structure CONT_INF has a lower contact valence band maximum value $Ev_{inf}$ strictly less than the effective valence band maximum value $Ev_{eff}$ of the absorbent planar structure SPA. The lower contact structure CONT_INF furthermore has a lower contact energy gap value $Eg_{inf}$ greater than or equal to the first effective energy gap value $Eg_{eff}$ of the first absorbent planar structure SPA. By way of non-limiting examples, it is possible to use the following materials to produce the lower contact: N+-doped InAsSb, N+-doped GaSb, N+-doped InGaAsSb, N+-doped InAlAsSb. As an alternative, it is possible to produce the lower contact CONT_INF with a superlattice SR_INF with a stack of N+-doped layers such as N+-doped InAs/InAsSb and N+-doped InAsSb/InGaAsSb.

The first transition structure $C_{tran1}$ has a valence band maximum value $Ev_{tran1}$ strictly greater than the effective valence band maximum value $Ev_{eff}$ of the first absorbent planar structure SPA. The first transition structure $C_{tran1}$ furthermore has an energy gap value of the first transition structure ($Eg_{tran1}$) strictly greater than the first effective energy gap value $Eg_{eff}$ of the absorbent planar structure SPA. By way of non-limiting examples, it is possible to use the following materials for the first transition structure: N-doped InAlAsSb, N-doped InGaAsSb. As an alternative, it is possible to produce the first transition structure with a superlattice $SR_{tran1}$ with a stack of N-doped layers such as $Al_{x1}Ga_{1-x1}As_{y1}Sb_{1-y1}/Al_{x2}Ga_{1-x2}As_{y2}Sb_{1-y2}$.

The second transition structure $C_{tran2}$ has a valence band maximum value $Ev_{tran1}$ strictly greater than that of the first transition structure $C_{tran1}$. The second transition structure $C_{tran2}$ furthermore has a conduction band minimum value $Ec_{tran2}$ strictly less than that of the first transition structure $C_{tran1}$. By way of non-limiting examples, it is possible to use the following materials for the first transition structure: N-doped InAlAsSb, N-doped InGaAsSb. As an alternative, it is possible to produce the first transition structure with a superlattice $SR_{tran2}$ with a stack of N-doped layers such as $Al_{x2}Ga_{1-x2}As_{y2}Sb_{1-y2}/Al_{x3}Ga_{1-x3}As_{y3}Sb_{1-y3}$.

More generally, it is possible to produce the series of transition structures $C_{tran\_i}$ confined between the upper contact structure CONT_SUP and the overall absorbent planar structure SPAG with a plurality of transition structures $C_{tran\_i}$ of rank i=1 to N going from the overall absorbent planar structure SPAG, where N is a non-zero natural integer. Each transition structure $C_{tran\_i}$ of rank i has a valence band maximum value $Ev_{tran\_i}$ strictly greater than that of the previous transition structure $C_{tran\_i-1}$ of rank i−1. This is then a stepped transition with respect to the valence band maximum values $Ev_{tran\_i}$, as illustrated in FIG. 4b.

As an alternative, it is conceivable to draw a limit at a single transition structure $C_{tran1}$ between the upper contact structure CONT_SUP and the overall absorbent planar structure SPAG.

The upper contact structure CONT_SUP has an upper contact valence band maximum value $Ev_{sup}$ strictly greater than the valence band maximum value of each of the transition structures $Ev_{tran1}$ and $Ev_{tran2}$. In one preferred embodiment, the upper contact structure CONT_SUP furthermore has an upper contact energy gap value $Eg_{sup}$ strictly greater than the energy gap value of each of the transition structures $Eg_{tran1}$ and $Eg_{tran2}$.

By way of non-limiting examples, it is possible to use the following materials to produce the upper contact: P+-doped GaSb, P+-doped AlGaSb, P+-doped InGaAsSb.

The implementation of the planar absorption structure Pxl according to the invention in the pixel described in FIG. 4a is a non-limiting illustration. The invention is compatible with other variants of pixel architectures that also make it possible to reduce dark current.

We emphasize that it is possible to produce the overall planar absorption structure SPAG of the pixel with a plurality of planar absorption structures stacked on one another. The overall planar absorption structure SPAG may thus contain a first overall planar absorption structure SPA according to any one of the embodiments of the invention with a thickness of 0.5 μm to 5 μm. In addition, the overall planar absorption structure SPAG may contain a second planar absorption structure arranged on the first planar absorption structure SPA made of a bulk material exhibiting lattice matching with the substrate and therefore not exhibiting degeneracy lifting. The second planar absorption structure has a thickness between 0.5 μm and 3 μm. This makes it possible to avoid placing the whole overall planar absorption structure SPAG under mechanical stress.

Figure 5:
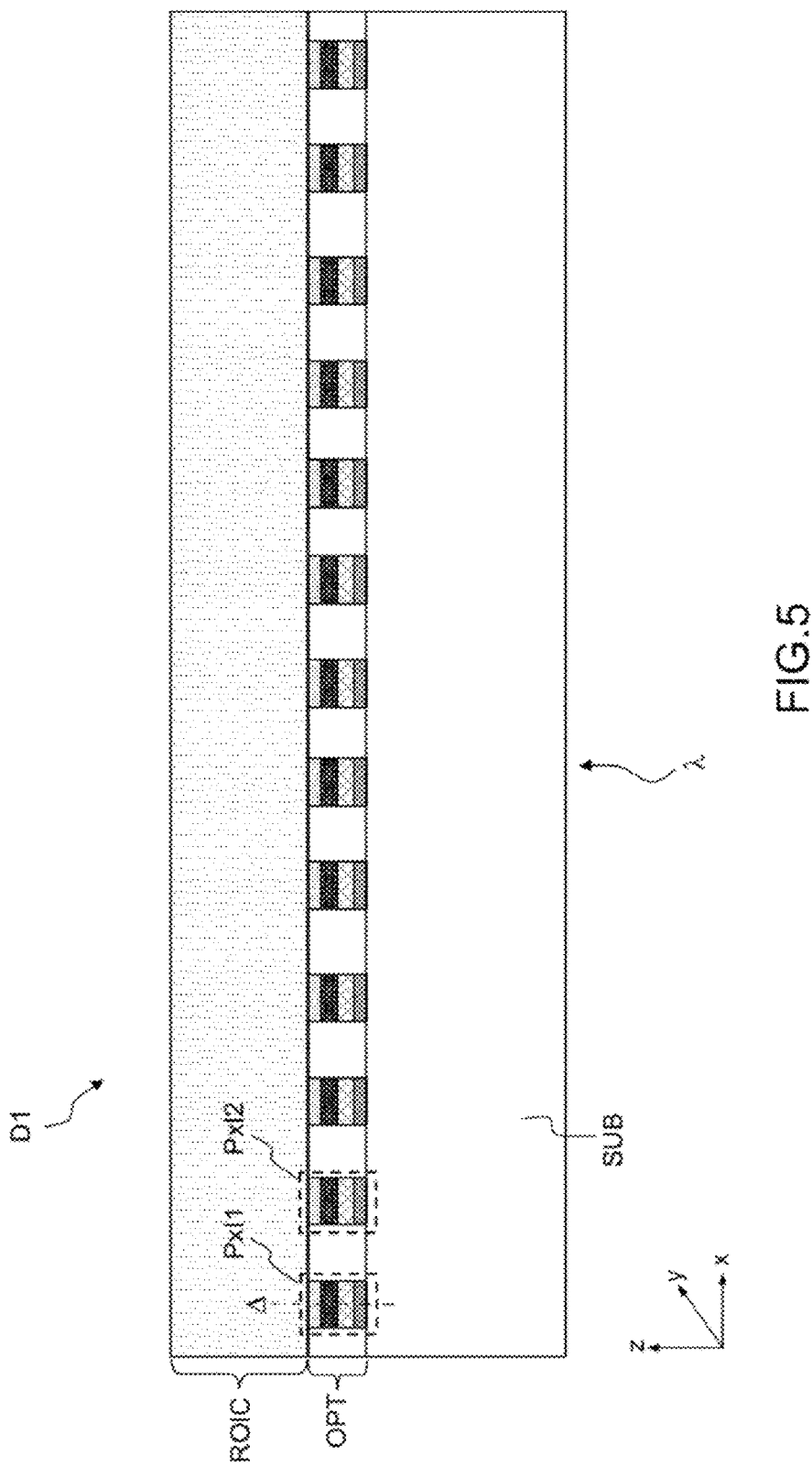
FIG. 5 illustrates a sectional view of an infrared radiation detection device comprising a plurality of pixels according to the invention.

FIG. 5 illustrates a sectional view of an infrared radiation detection device D1 comprising a plurality of pixels Pxl according to the invention.

The infrared radiation detection device D1 is mounted on the substrate SUB. This is a hybrid optoelectronic system, comprising: an optical part OPT based on a matrix formed by a plurality of pixels arranged in rows and columns and an electronic part consisting of a readout integrated circuit ROIC on a semiconductor substrate for individually reading the signal from each pixel of the optical part OPT. A pixel belonging to the optoelectronic system may contain a single photosensitive element or a plurality of interconnected photosensitive elements. As an alternative, for specific applications, it is conceivable to produce the optical part OPT with a single pixel Pxl. The readout integrated circuit ROIC is produced by way of a plurality of transistors and thin layers made of conductive, semiconductor or dielectric material using CMOS (Complementary Metal-Oxide Semiconductor) technology on a silicon substrate. For each pixel Pxl, a buried electrode is associated therewith in order to read the signals generated by the charge carriers photogenerated by the photodetecting structure of a pixel Pxl.

The invention claimed is:

1. A device (D1) for detecting infrared radiation, comprising at least one pixel (Pxl) having an axis (Δ) in a direction Z, said pixel comprising a first absorbent planar structure (SPA) comprising at least one semiconductor layer ($C_{mm}$, C1, C2);
    each layer ($C_{mm}$, C1, C2) of the first absorbent planar structure (SPA) being arranged in a crystal lattice structure;
    the first absorbent planar structure (SPA) being N-doped and being produced epitaxially on a substrate (Sub), and the composition of the materials used to produce the at least one layer ($C_{mm}$, C1, C2) of the first absorbent planar structure (SPA) being chosen such that:
    the first absorbent planar structure (SPA) has an effective valence band ($BV_{eff}$) formed by a plurality of energy levels ($Ev_{hh}$, $Ev_{lh}$); each energy level ($Ev_{hh}$, $Ev_{lh}$) being occupied by one of:
    a first type of positive charge carrier, called heavy holes (hh), having a first effective mass ($m_{hh}$);
    or a second type of positive charge carrier, called light holes (lh), having a second effective mass ($m_{lh}$) strictly less than the first effective mass ($m_{hh}$);
    the maximum energy level of the effective valence band ($BV_{eff}$) being occupied by light holes (lh) along the axis (Δ) of the pixel;
    the crystal lattice structure of said layer does not exhibit any dislocations resulting from mechanical relaxation of said lattices;
    the effective mass of the positive charge carriers along the axis of the pixel (Δ) being less than half the effective mass of the positive charge carriers in directions defining a plane orthogonal to the axis of the pixel (Δ).

2. The device (D1) for detecting infrared radiation as claimed in claim 1, wherein the substrate (Sub) is arranged in a crystal lattice structure and wherein the composition of the materials used to produce the at least one layer ($C_{mm}$, C1, C2) of the first absorbent planar structure (SPA) is chosen such that
    the lattices of the at least one layer ($C_{mm}$, C1, C2) forming said absorbent planar structure (SPA) experience internal mechanical stresses so as to adapt to the lattices of the crystal structure of the substrate (SUB);
    and such that the stress resulting from the sum of the internal mechanical stresses is a tensile stress.

3. The device (D1) for detecting infrared radiation as claimed in claim 2, wherein the composition of the materials used to produce the at least one layer ($C_{mm}$, C1, C2) of the first absorbent planar structure (SPA) is chosen such that the amplitude of the stress resulting from the sum of the internal mechanical stresses is less than a predetermined dislocation limit stress;
    the density of dislocations in the first absorbent planar structure being strictly less than $10^4$ dislocations/cm2.

4. The device (D1) for detecting infrared radiation as claimed in claim 2, wherein the first absorbent planar structure (SPA) comprises a first superlattice (SR) comprising a stack along the axis of the pixel (Δ) of an elementary group of semiconductor layers (G1) comprising:
    a first layer (C1) made of a first semiconductor material (SC1) having
    a first conduction band minimum value (Ec1);
    a first valence band maximum value (Ev1);
    a first energy gap value (Eg1);
    at least one second layer (C2) made of a second semiconductor material (SC2) having:
    a second conduction band minimum value (Ec2) strictly less than the first conduction band minimum value (Ec1);
    a second valence band maximum value (Ev2) strictly less than the first valence band maximum value (Ev1);
    and a second energy gap value (Eg2);
    the lattices of the first layer (C1) experiencing tensile stresses and the lattices of the second layer (C2) experiencing compressive stresses.

5. The device (D1) for detecting infrared radiation as claimed in claim 4, wherein
    the first superlattice has a first effective valence band maximum value ($Ev_{eff}$),
    and wherein the positive charge carriers in the first layer (C1) of an elementary group (G1) see an energy barrier (BE) equal to the difference between:
    the maximum energy level ($Ev_{hh}$) of the effective valence band ($BV_{eff}$) occupied by heavy holes (hh);
    and a first effective valence band maximum value ($Ev_{eff}$);
    the product of said energy barrier (BE) and the thickness ($e_{m2}$) of the second layer (C2) being less than a predetermined value.

6. The device (D1) for detecting infrared radiation as claimed in claim 4, wherein the second semiconductor material (SC2) is the ternary alloy $InAs_{y3}Sb_{1-y3}$,
    where y3 is the molar fraction of arsenic in the alloy $InAs_{y3}Sb_{1-y3}$.

7. The device (D1) for detecting infrared radiation as claimed in claim 6,
    wherein the first semiconductor material (SC1) is the quaternary alloy $Ga_{x3}In_{1-x3}As_{y4}Sb_{1-y4}$,
    where x3 is the molar fraction of gallium in the alloy $Ga_{x3}In_{1-x3}As_{y4}Sb_{1-y4}$ and y4 is the molar fraction of arsenic in the alloy $Ga_{x3}In_{1-x2}As_{y4}Sb_{1-y4}$.

8. The device (D1) for detecting infrared radiation as claimed in claim 7, wherein:
    the molar fraction y3 of arsenic in the alloy $InAs_{y3}Sb_{1-y3}$ is between 0.6 and 0.88,
    the molar fraction x3 of gallium in the alloy $Ga_{x3}In_{1-x3}As_{y4}Sb_{1-y4}$ is between 0.2 and 0.5, and the molar fraction y4 of arsenic in the alloy $Ga_{x3}In_{1-x3}As_{y4}Sb_{1-y4}$ is between a minimum value ($y4_{min}$) and a maximum value ($y4_{max}$) such that:

the minimum value ($y4_{min}$) of the molar fraction y4 of arsenic in the alloy $Ga_{x3}In_{1-x3}As_{y4}Sb_{1-y4}$ being an affine function of the molar fraction x3 of gallium in the alloy $Ga_{x3}In_{1-x3}As_{y4}Sb_{1-y4}$ characterized by a leading coefficient equal to −0.92 and an ordinate at the origin equal to 0.93, the maximum value ($y4_{max}$) of the molar fraction y4 of arsenic in the alloy $Ga_{x3}In_{1-x3}As_{y4}Sb_{1-y4}$ being an affine function of the molar fraction x3 of gallium in the alloy $Ga_{x3}In_{1-x3}As_{y4}Sb_{1-y4}$ characterized by a leading coefficient equal to −0.66 and an ordinate at the origin equal to 1.13.

9. The device (D1) for detecting infrared radiation as claimed in claim 1, wherein the effective mass of the holes carrying positive charges along the axis of the pixel (Δ) is less than one tenth of the mass of a free electron.

10. The device (D1) for detecting infrared radiation as claimed in claim 1, wherein the difference between the maximum energy level occupied by light holes ($Ev_{lh}$) and the maximum energy level occupied by heavy holes ($Ev_{hh}$) is greater than the product of the Boltzmann constant and the operating temperature.

11. The device (D1) for detecting infrared radiation as claimed in claim 1, wherein the first absorbent planar structure (SPA) consists of a single layer ($C_{mm}$) made of a bulk III-V semiconductor material.

12. The device (D1) for detecting infrared radiation as claimed in claim 11, wherein the bulk semiconductor material is the quaternary alloy $Ga_{x1}In_{1-x1}As_{y1}Sb_{1-y1}$, where x1 is the molar fraction of gallium in the alloy $Ga_{x1}In_{1-x1}As_{y1}Sb_{1-y1}$ and y1 is the molar fraction of arsenic in the alloy $Ga_xIn_{1-x1}As_{y1}Sb_{1-y1}$.

13. The device (D1) for detecting infrared radiation as claimed in claim 12, wherein:

the substrate is made of gallium antimonide GaSb;

the molar fraction x1 of gallium Ga in the alloy $Ga_xIn_{1-x1}As_{y1}Sb_{1-y1}$ is between 0 and 1;

and the molar fraction y1 of arsenic As in the alloy $Ga_xIn_{1-x1}As_{y1}Sb_{1-y1}$ is between a minimum value ($y1_{min}$) and a maximum value ($y1_{max}$) such that:

the minimum value ($y1_{min}$) is an affine function of the molar fraction x1 of gallium Ga in the alloy $Ga_xIn_{1-x1}As_{y1}Sb_{1-y1}$ characterized by a leading coefficient equal to −0.92 and an ordinate at the origin equal to 0.93, the maximum value ($y1_{max}$) of the molar fraction y1 of arsenic As in the alloy $Ga_xIn_{1-x1}As_{y1}Sb_{1-y1}$ is an affine function of the molar fraction x1 of gallium Ga in the alloy $Ga_xIn_{1-x1}As_{y1}Sb_{1-y1}$ characterized by a leading coefficient equal to −0.92 and an ordinate at the origin equal to 0.97.

14. The device (D1) for detecting infrared radiation as claimed in claim 12, wherein:

the substrate is made of indium antimonide InSb;

and the molar fraction x2 of gallium Ga in the bulk semiconductor material is between 0.02 and 0.05;

and the molar fraction y2 of arsenic As in the bulk semiconductor material is between 0.02 and 0.05.

15. The detection device (D1) as claimed in claim 1, wherein the first absorbent planar structure (SPA) has a first effective valence band maximum value ($Ev_{eff}$), a first effective conduction band minimum value ($Ec_{eff}$) and a first effective energy gap value ($Eg_{eff}$); the pixel comprises, along its axis (Δ) and in this order:

the substrate (SUB);

a lower contact structure (CONT_INF) made of a third semiconductor material (SC3) or of a lower contact superlattice ($SR_{inf}$), the structure being N+-doped and having:

a lower contact valence band maximum value ($Ev_{inf}$) strictly less than the effective valence band maximum value ($Ev_{eff}$) of the first absorbent planar structure (SPA);

and a lower contact energy gap value ($Eg_{inf}$) less than or equal to the first effective energy gap value ($Eg_{eff}$) of the first absorbent planar structure (SPA);

an overall absorbent planar structure (SPAG) comprising:

the first absorbent planar structure (SPA); the layers (C1, C2, $C_{mm}$) of said first absorbent planar structure (SPA) being N-doped;

one or more transition structures ($C_{tran1}$, $C_{tran2}$, $C_{tran\_i}$); the transition structure ($C_{tran1}$) in contact with the overall absorbent planar structure (SPAG) being called initial transition structure; the initial transition structure being made of a fourth semiconductor material (SC4) or of a first superlattice of the transition structure ($SR_{tran1}$), the structure being N-doped and having:

a valence band maximum value of the initial transition structure ($Ev_{tran1}$) strictly greater than the effective valence band maximum value ($Ev_{eff}$) of the first absorbent planar structure (SPA);

and an energy gap value of the initial transition structure ($Eg_{tran1}$) strictly greater than the first effective energy gap value ($Eg_{eff}$) of the first absorbent planar structure (SPA);

an upper contact structure (CONT_SUP) made of a fifth semiconductor material (SC5) or of an upper contact superlattice ($SR_{sup}$), the structure being P+-doped and having:

an upper contact valence band maximum value ($Ev_{sup}$) strictly greater than the valence band maximum value of each transition structure ($Ev_{tran1}$, $Ev_{tran1}$);

and an upper contact energy gap value ($Eg_{sup}$) strictly greater than the energy gap value of each transition structure ($Eg_{tran1}$, $Eg_{tran1}$).

16. The detection device (D1) as claimed in claim 15, wherein the pixel comprises multiple transition structures ($C_{tran1}$, $C_{tran2}$, $C_{tran\_i}$) of rank i=1 to N increasing going from the overall absorbent planar structure (SPAG) to the upper contact structure (CONT_SUP), where N is a non-zero natural integer, such that:

each transition structure ($C_{tran2}$, $C_{tran\_i}$) of rank i=2 to N has a valence band maximum value ($Ev_{tran2}$) strictly greater than the valence band maximum value of the transition structure ($Ev_{tran1}$) of rank i−1.

* * * * *

UNITED STATES PATENT AND TRADEMARK OFFICE
CERTIFICATE OF CORRECTION

PATENT NO. : 12,272,718 B2
APPLICATION NO. : 18/275174
DATED : April 8, 2025
INVENTOR(S) : Axel Evirgen et al.

It is certified that error appears in the above-identified patent and that said Letters Patent is hereby corrected as shown below:

In the Claims

In Claim 1, Column 19, Line 44, "$(BV_{\mathit{eff}})$" should be -- $(BV_{eff})$ --.

In Claim 1, Column 19, Line 53, "$(BV_{\mathit{eff}})$" should be -- $(BV_{eff})$ --.

In Claim 5, Column 20, Line 40, "$(Ev_{\mathit{eff}})$" should be -- $(Ev_{eff})$ --.

In Claim 5, Column 20, Line 45, "$(BV_{\mathit{eff}})$" should be -- $(BV_{eff})$ --.

In Claim 5, Column 20, Line 46, "$(Ev_{\mathit{eff}})$" should be -- $(Ev_{eff})$ --.

In Claim 15, Column 22, Line 5, "$(Ev_{\mathit{eff}})$" should be -- $(Ev_{eff})$ --.

In Claim 15, Column 22, Line 6, "$(Ec_{\mathit{eff}})$" should be -- $(Ec_{eff})$ --.

In Claim 15, Column 22, Line 7, "$(Eg_{\mathit{eff}})$" should be -- $(Eg_{eff})$ --.

In Claim 15, Column 22, Line 12, "$(SR_{\mathit{inf}})$" should be -- $(SR_{inf})$ --.

In Claim 15, Column 22, Line 14, "$(Ev_{\mathit{inf}})$" should be -- $(Ev_{inf})$ --.

In Claim 15, Column 22, Line 16, "$(Ev_{\mathit{eff}})$" should be -- $(Ev_{eff})$ --.

In Claim 15, Column 22, Line 18, "$(Eg_{\mathit{inf}})$" should be -- $(Eg_{inf})$ --.

In Claim 15, Column 22, Line 19, "$(Eg_{\mathit{eff}})$" should be -- $(Eg_{eff})$ --.

Signed and Sealed this
Ninth Day of December, 2025

John A. Squires
*Director of the United States Patent and Trademark Office*

In Claim 15, Column 22, Line 34, "(Ev$_{eff}$)" should be -- (Ev$_{\text{eff}}$) --.

In Claim 15, Column 22, Line 38, "(Eg$_{eff}$)" should be -- (Eg$_{\text{eff}}$) --.